(12) United States Patent
Atobe et al.

(10) Patent No.: US 6,603,159 B2
(45) Date of Patent: Aug. 5, 2003

(54) SYSTEM AND METHODS FOR MANUFACTURING AND USING A MASK

(75) Inventors: Mitsuro Atobe, Suwa (JP); Shinichi Kamisuki, Suwa (JP); Ryuichi Kurosawa, Suwa (JP); Shinichi Yotsuya, Suwa (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 10/053,907

(22) Filed: Jan. 24, 2002

(65) Prior Publication Data

US 2002/0111035 A1 Aug. 15, 2002

(30) Foreign Application Priority Data

Jan. 26, 2001 (JP) .......................... 2001-018973
Jan. 15, 2002 (JP) .......................... 2002-005909

(51) Int. Cl.[7] .......................... H01L 33/00; H01L 29/78
(52) U.S. Cl. ........................ 257/280; 257/281; 438/637; 438/638
(58) Field of Search ................. 257/294, 280, 257/281; 438/637, 638

(56) References Cited

U.S. PATENT DOCUMENTS

| | | | | |
|---|---|---|---|---|
| 3,765,969 A | * | 10/1973 | Kragness et al. | |
| 4,172,005 A | * | 10/1979 | Muraoka et al. | |
| 5,032,538 A | * | 7/1991 | Bozler et al. | |
| 5,049,968 A | * | 9/1991 | Nakagawa | |
| 5,708,264 A | * | 1/1998 | Hawkins et al. | |
| 6,235,626 B1 | * | 5/2001 | Makino et al. | |
| 6,423,563 B2 | * | 7/2002 | Fukada et al. | |

FOREIGN PATENT DOCUMENTS

| | | |
|---|---|---|
| JP | 04-236758 | 8/1992 |
| JP | 2001-185350 | 7/2001 |

OTHER PUBLICATIONS

Tang et al., C.W., *Organic Electroluminescent Diodes*, Appl. Phys. Lett., 51(12), Sep. 21, 1987, pp. 913–915.

Carter et al., J.C., *Operating Stability of Light–Emitting Polymer Diodes Based on Poly(p–phenylene vinylen)*, Appl. Phys. Lett 71(1), Jul. 7, 1997, pp. 34–36.

* cited by examiner

Primary Examiner—Stephen D. Meier
(74) Attorney, Agent, or Firm—Oliff & Berridge, PLC

(57) ABSTRACT

The present invention provides a mask for use in forming a thin-layer pattern of an organic electroluminescence element having high-precision pixels. The mask is manufactured by wet-etching a (100) silicon wafer (single crystal silicon substrate) in a crystal orientation-dependent anisotropic fashion so as to form through-holes having (111)-oriented walls serving as apertures corresponding to a thin-layer pattern to be formed.

13 Claims, 19 Drawing Sheets (a)  (b)  (c)

SYSTEM AND METHODS FOR MANUFACTURING AND USING A MASK

BACKGROUND OF THE INVENTION

1. Field of Invention

The present invention relates to a mask used for directly forming a thin layer pattern on the surface of a layer, a method of manufacturing such a mask, a method of manufacturing an organic electroluminescence (EL) device using such a mask, and an organic EL device manufactured using such a method.

2. Description of Related Art

In recent years, increasingly rapid advancements have been made in the art of an organic electroluminescence display device using organic electroluminescence elements (light emitting elements having a structure in which a luminescent layer formed of an organic material is disposed between an electrode and a cathode electrode) disposed for respective pixels. The organic electroluminescence display devices are expected to be used as emissive-type displays instead of the conventional liquid crystal display devices. Currently, known materials for forming a luminescent layer in an organic electroluminescence element can include an aluminum quinolino complex (Alq3) that is a low-molecular organic material and poly p-phenylenevinylene that is a macromolecular organic material.

A technique of forming a luminescent layer using a low-molecular organic material by vacuum evaporation is disclosed, for example, in Appl. Phys. Lett. 51(12), 21 September, 1987, p.913. A technique of forming a luminescent layer using a macromolecular organic material by a coating process is disclosed, for example, in Appl. Phys. Lett. 71(1), 7 July, 1997, p.34.

When forming a luminescent layer using a low-molecular organic material by vacuum evaporation, a metal mask (made of a metal such as stainless steel so as to have apertures corresponding to a thin-layer pattern to be formed) is conventionally used. In this technique, a thin-layer pattern corresponding to pixels can be directly formed on a substrate surface. In this technique, in contrast to a technique using a conjunction of a photolithographic process and an etching process in which a thin layer is first formed over the entire surface of a substrate and then the thin layer is patterned by photolithographic and etching processes, a thin layer having a desired pattern is directly formed using a metal mask.

However, the technique using a metal mask has the following problems. For example, if, in order to manufacture apertures so as to precisely correspond to a thin-layer pattern with a very small size, a metal mask having a small thickness is employed or if the distance between adjacent apertures is reduced, the mask can be bent or deformed during a process. In order to prevent the mask from being bent or deformed, it is often required that a tensile force be applied to the mask during the layer formation process. However, the tensile force can cause the apertures to be deformed. Thus, even if the metal mask is placed at a correct location, there is a possibility that the locations of the apertures deviate from the correct locations corresponding to the thin-layer pattern to be formed on a substrate.

A metal mask may be manufactured by forming apertures in a metal plate using a wet etching technique, a plating technique, a pressing technique, or a laser beam processing technique. However, in these conventional techniques, the size accuracy of apertures is limited to ±3 µm, which is not sufficient to manufacture high-precision pixels.

SUMMARY OF THE INVENTION

In view of the above, it is an object of the present invention to provide a mask for use in directly producing a thin-film pattern on a substrate surface without having to perform a photolithographic process (that is, producing a thin film having a desired pattern on a substrate surface), having mask apertures formed with high enough accuracy (±1 µm, for example) to form high-precision pixels without causing the mask to be bent or deformed and without having to applying a tensile force to the mask during a thin-film formation process.

It is another object of the present invention to provide an organic electroluminescence display device having high-precision pixels manufactured by forming a thin-layer pattern serving as a layer (such as a luminescent layer) of the organic electroluminescence element using a mask according to the present invention.

According to an aspect of the present invention, there is provided a mask for use in manufacturing a thin-layer pattern serving as a layer of an organic electroluminescence element by means of vacuum evaporation. The mask can include an aperture corresponding to the thin-layer pattern and be formed of single crystal silicon and having a through-hole serving as the aperture formed by anisotropic wet etching using a crystal orientation dependence.

According to another aspect of the present invention, there is provided a mask for use in manufacturing a thin-layer pattern serving as a layer of an organic electroluminescence element by means of vacuum evaporation. The mask can include an aperture corresponding to the thin-layer pattern, and be formed of single crystal silicon so as to have a mask surface formed by a (100) surface of the single crystal silicon and have a through-hole with (111)-oriented walls serving as the aperture.

According to still another aspect of the present invention, there is provided a mask for use in manufacturing a thin layer having a predetermined pattern on a substrate surface. The mask can include an aperture corresponding to the pattern and be formed of single crystal silicon. The size of the aperture can change in a mask thickness direction such that the size has, at a boundary position, a minimum value corresponding to the size of the pattern and the size increasing toward both mask surfaces. Further, the distance from the boundary position to one mask surface and the distance from the boundary position to the opposite mask surface can be different from each other.

In this mask according to the present invention, preferably, the mask surface being formed by a (100)-surface of single crystal silicon, and the aperture including two wall portions that are tapered in opposite directions and that expand from the boundary position toward respective mask surfaces opposite to each other, and at least one wall portion being oriented in a (111)-direction.

In this mask according to the present invention, the mask can have a thin portion in which the aperture is formed and a thick portion in which no aperture is formed.

Preferably, the mask according to the present invention may be manufactured by a process having four features described below.

Firstly, a thin portion having a uniform thickness can be formed in a partial substrate area by etching a single crystal silicon substrate having a (100)-oriented crystal surface in a thickness direction of the single crystal silicon substrate. A first protective layer pattern having a through-hole corresponding to the aperture is formed on a first surface of the thin portion. A second protective layer pattern having a recessed portion can be formed at a location corresponding to the location of the aperture, on a second surface of the thin portion.

Secondly, after the above-described process, a through-hole can be formed in the thin portion at a location corresponding to the location of the aperture by anisotropic wet etching using the crystal orientation dependence such that the aperture size of the through-hole is greater at the first surface than at the boundary position and is smaller at the second surface than at the boundary position and than the size of the recessed portion.

Thirdly, the second protective layer pattern can be converted into a third protective layer pattern by performing wet etching such that the bottom of the recessed portion is perforated so that the recessed portion becomes a through-hole while maintaining the protective layer on the first surface.

Fourthly, the thin portion can be anisotropic wet-etched using the crystal orientation dependence such that a part of the thin portion exposed via the through-hole formed in the third protection layer pattern is etched until the aperture size at the boundary position becomes equal to a predetermined size.

According to still another aspect of the present invention, there is provided a method of manufacturing a mask for use in manufacturing a thin-layer pattern serving as a layer of an organic electroluminescence element by means of vacuum evaporation, the mask having an aperture corresponding to the thin-layer pattern. The method can include forming a through-hole as the aperture in which a single crystal silicon substrate having a (100)-oriented crystal surface by anisotropic wet etching using the crystal orientation dependence such that a through-hole having a (111)-oriented wall.

The method may preferably further include thinning the single crystal silicon substrate by etching in a thickness direction thereof such that a thin portion having a uniform thickness is formed in an partial area of the single crystal silicon substrate. After the step of thinning the single crystal silicon substrate, the through-hole can be formed in the thin portion by the anisotropic wet etching using the crystal orientation dependence.

According to another aspect of the present invention, there is provided a method of manufacturing a mask for use in manufacturing a thin layer having a predetermined pattern on a substrate surface, the mask having a aperture corresponding to the pattern. The method can include preparing a substrate including a base substrate, an insulating layer formed on one surface of the base substrate, and a single crystal silicon layer formed on the insulating layer. The method can further include removing the base substrate such that at least a partial area of the base substrate is removed over the entire thickness of the base substrate, and anisotropic etching the single crystal silicon layer remaining in the area from which the base substrate has been removed, so as to form a through-hole serving as the aperture in the single crystal silicon layer.

According to still another aspect of the present invention, there is provided a method of manufacturing an organic electroluminescence device. The method can include forming a thin layer pattern serving as a layer of the organic electroluminescence element by performing vacuum evaporation using a mask according to the present invention or a mask manufactured according to a mask production method according to the present invention.

According to still another aspect of the present invention, there is provided an organic electroluminescence device manufactured by an organic electroluminescence device production method according to the present invention.

DETAILED DESCRIPTION OF PREFERRED EMBODIMENTS

Figure 1:
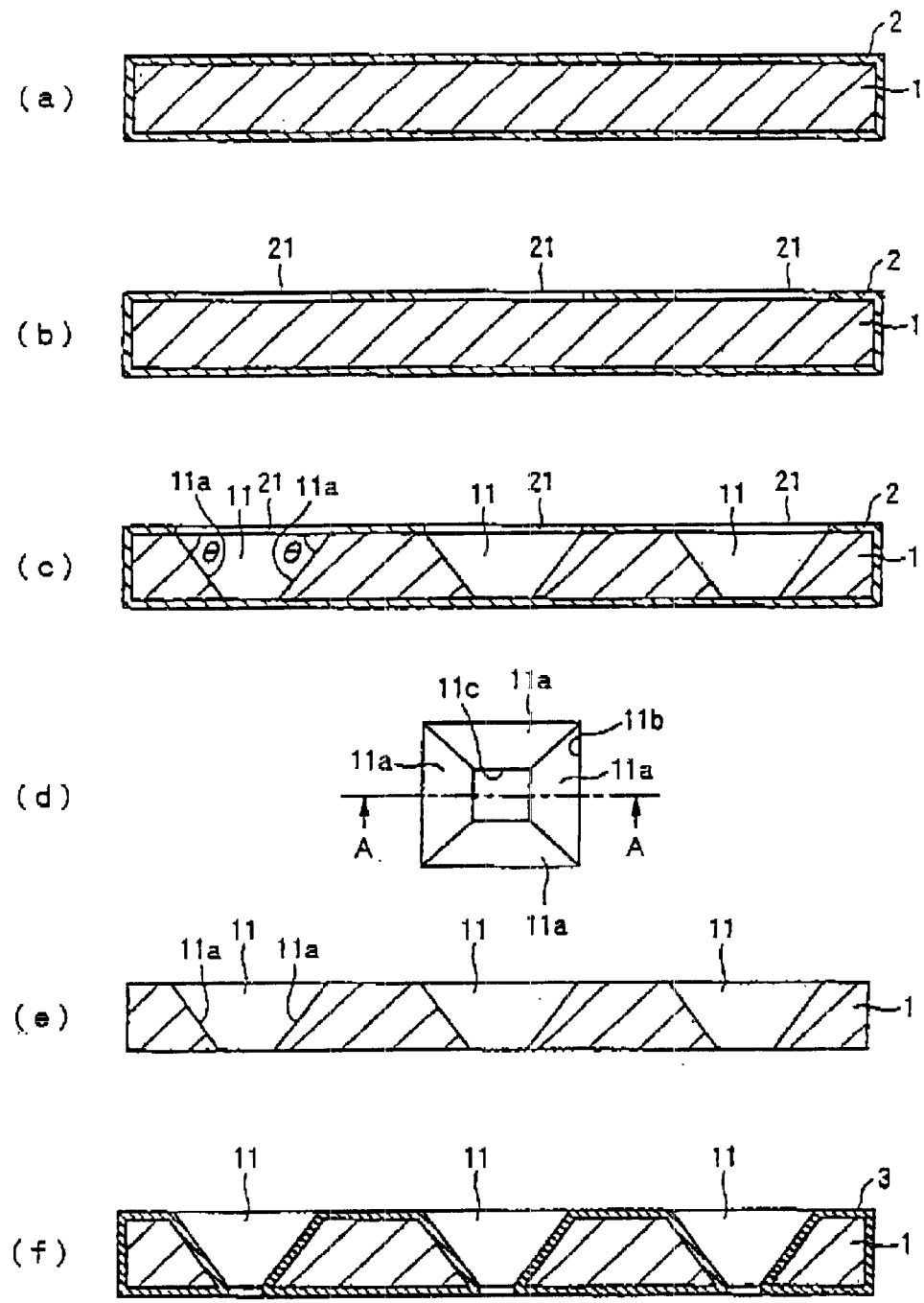
FIGS. 1(a) to 1(f) are diagrams illustrating a mask and a method of manufacturing the same according a first embodiment of the present invention.

A mask and a method of manufacturing the mask according to a first embodiment of the present invention are described below with reference to FIG. 1.

First, as shown in FIG. 1(a), a silicon wafer (single crystal silicon substrate) 1 with a surface orientation of (100) is prepared. A silicon oxide layer 2 is then formed over the entire surface of the wafer 1 by a CVD technique. Openings 21 are then formed in the silicon oxide layer 2 on one surface (the upper surface in this specific example) of the wafer 1 such that the shapes of the resultant openings 21 correspond to the shapes (such as a rectangle or a square, while the openings 21 of the present example have a square shape) of openings of a mask and such that the surface of the wafer 1 is exposed via the openings 21. The formation of the openings 21 may be accomplished by a combination of a photolithographic process and a dry etching process. FIG. 1(b) shows the structure obtained at this stage of the process.

The wafer 1 is then soaked in an aqueous solution of potassium hydroxide for a predetermined time so that the silicon surface exposed via the openings 21 is anisotropically wet-etched using etching property dependence on the crystal orientation. As a result, through-holes 11 each having four (111)-oriented walls 11a are formed in the wafer 1, at locations corresponding to the openings 21.

FIG. 1(c) shows the structure obtained at this stage of the process. FIG. 1(d) is a plan view of a through-hole 11 formed in the wafer 1, viewed from the upper side of the wafer 1 (that is, from the side where the openings 21 are formed), wherein FIG. 1(c) is a cross-sectional view taken along a line A—A of FIG. 1(d).

As shown in FIGS. 1(c) and 1(d), the through-holes 11 are formed such that four walls 11 a of each through-hole 11 are oriented in (111) directions at an angle of 54.74° (θ=54.74°) to the (100)-surface of the wafer 1 and such that the distance between two opposing walls 11 a is greatest at the upper surface of the wafer 1 and decreases toward the lower surface of the wafer 1 (that is, the through-holes 11 are tapered). That is, each through-hole 11 has a shape that is manufactured when an apex portion of a quadrangular pyramid whose base corresponds to a square of an opening 21 formed in the silicon oxide 2 is cut along a plane parallel with the base plane.

Thus, the upper-side opening 11b of each through-hole 11 has a square shape that is substantially equal in size to a corresponding opening 21 formed in the silicon oxide layer 2, and the lower-side opening 11c of each through-hole 11 has a square shape that is smaller than the opening 11b on the upper side of the wafer.

The silicon oxide layer 2 is then removed by soaking the wafer 1 in an aqueous solution of a hydrofluoric acid-base etchant. FIG. 1(e) shows the structure obtained at this stage of the process.

A silicon oxide layer 3 with a uniform thickness is then formed such that the entire surface of the silicon wafer 1, including the walls 11a of the respective through-holes 11, is covered with the silicon oxide layer 3. The silicon oxide layer 3 may be formed by thermal oxidation. FIG. 1(f) shows the structure obtained at this stage of the process.

Thus, a mask is obtained which is made of single crystal silicon so as to have a mask surface formed by a (100)-surface of the single crystal silicon and have apertures with walls oriented in (111)-directions formed by through-holes 11. Because this mask is made of single crystal silicon, even when the mask thickness and the opening-to-opening distance are small, the mask can be handled without causing bending or deformation. Bending does not occur even if no tensile force is applied during the layer formation process. The openings can be formed with high enough precision to form high-precision pixels.

Because the through-holes 11 formed by the present method has a tapered structure, if the mask is placed such that a mask surface (lower wafer surface at which opening ends 11c are located) at which the through-holes 11 have smaller aperture sizes than at the opposite surface is brought into proximity to a substrate surface on which a thin-layer pattern is to be formed, it is possible to prevent the resultant thin-layer pattern from becoming thin at its edge.

In order to use the mask in the above-described manner, the size of the smaller end of each opening 11c should correspond to the size of the thin-layer pattern to be formed. Because the size of each opening 11c is determined by the size of the corresponding opening 21 formed in the silicon oxide layer 2 and by the thickness of the wafer 1, the size of each opening 21 formed in the silicon oxide layer 2 and the thickness of the wafer 1 should be selected so that the size of each opening 11c corresponds to the size of the thin-layer pattern to be formed.

The silicon oxide layer 3 serves as a protective layer of the mask, and thus the mask does not necessarily need to have the silicon oxide layer 3. That is, the final structure of the mask may not include the silicon oxide layer 3 and be similar to that shown in FIG. 1(e). In this case, the size of the opening 21 formed in the silicon oxide layer 2 should be determined so that the size of the opening 11c of the through-hole 11 becomes equal to the size of the thin-layer pattern to be formed.

Figure 2:
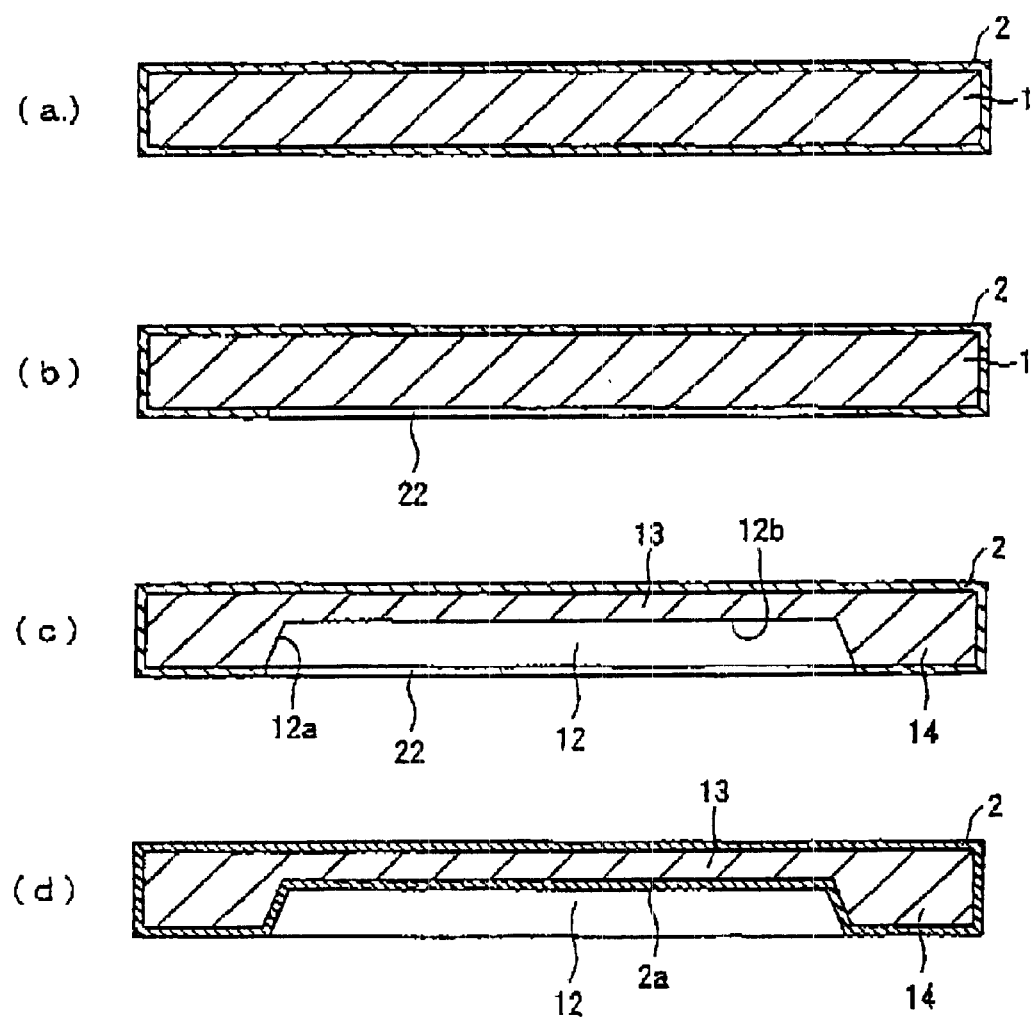
FIGS. 2(a) to 2(d) are diagrams illustrating a mask and a method of manufacturing the same according a second embodiment of the present invention.
Figure 3:
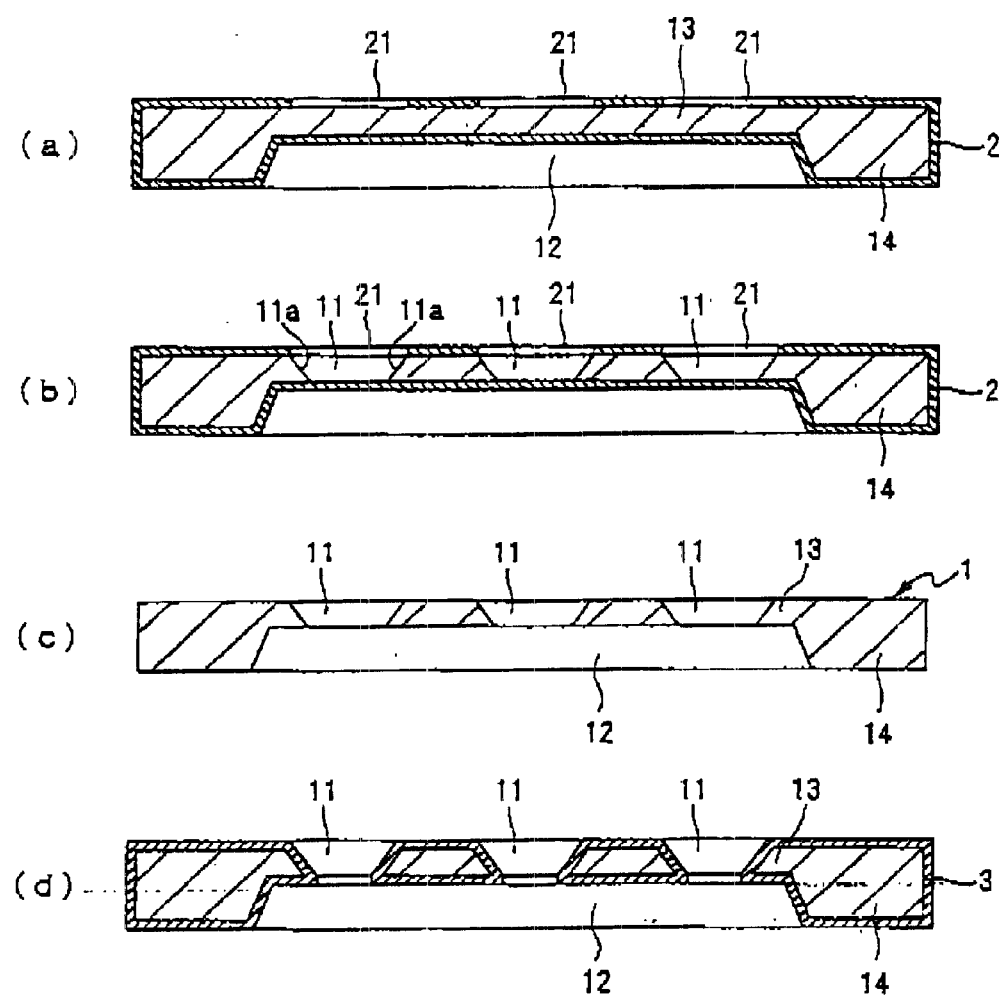
FIGS. 3(a) to 3(d) are diagrams illustrating a mask and a method of manufacturing the same according a second embodiment of the present invention.

A mask and a method of manufacturing it according to a second embodiment of the present invention are described below with reference to FIGS. 2 and 3.

First, as shown in FIG. 2(a), a (100) silicon wafer (single crystal silicon substrate) 1 with a thickness equal to that employed in the first embodiment is prepared. A silicon oxide layer 2 is then formed over the entire surface of the wafer 1 by using a CVD technique. An opening 22 is then formed in the silicon oxide layer 2 on one surface (lower surface in this specific example) of the wafer 1 such that the lower surface of the wafer 1 is exposed via the opening 22 except for a peripheral area of the lower surface. The formation of the openings 22 may be accomplished by using a combination of a photolithographic process and an etching process. FIG. 2(b) shows the structure obtained at this stage of the process.

The wafer 1 is then soaked in an aqueous solution of potassium hydroxide for a predetermined time so that the silicon surface exposed via the openings 22 is wet-etched in a crystal orientation-dependent anisotropic fashion. As a result, a recessed portion 12 having (111)-oriented walls 12a is formed in the wafer 1 at a location corresponding to the opening 22, and thus a thin portion 13 with a uniform thickness (20 μm, for example) is formed in the wafer 1 at the bottom of the opening 22, and a raised portion 14 is formed in the peripheral area on the upper surface of the wafer 1. FIG. 2(c) shows the structure obtained at this stage of the process.

The time during which the wafer 1 is soaked in the aqueous solution of potassium hydroxide is determined, taking into account the original thickness of the wafer 1, so that the thickness of the thin portion 13 has a desired value. The walls 12a of the recessed portion 12, as with the walls 11a of the through-holes 11 according to the first embodiment, are oriented in (111) directions at an angle of 54.74° to the (100)-surface of the wafer 1. However, in this case, the distance between two opposing walls 11a is greatest at the lower surface of the wafer 1 and decreases toward the upper surface of the wafer 1 (that is, the recessed portion 12 is tapered).

A silicon oxide layer 2a is then formed by using a thermal oxidation such that the walls 12a and the bottom 12b of the recessed portion 12 is covered with the silicon oxide layer 2a. FIG. 2(d) shows the structure obtained at this stage of the process.

Thereafter, rectangular-shaped openings 21 corresponding to openings of the mask to be manufactured are formed in the silicon oxide layer 2 on the upper surface (opposite to the surface where the recessed portion 12 is formed) of the thin portion 13 such that the surface of the wafer 1 is exposed via the openings 21. The formation of the openings 21 may be accomplished by using a combination of a photolithographic process and a dry etching process. FIG. 3(a) shows the structure obtained at this stage of the process.

The wafer 1 is then soaked in an aqueous solution of potassium hydroxide for a predetermined time so that the silicon surface exposed via the openings 21 is anisotropically wet-etched using etching property dependence on the crystal orientation. As a result, through-holes 11 each having four (111)-oriented walls 11a are formed in the wafer 1, at locations corresponding to the openings 21. FIG. 3(b) shows the structure obtained at this stage of the process.

As in the first embodiment, the through-holes 11 are formed such that four walls 11a of each through-hole 11 are oriented in (111) directions at an angle of 54.74° to the (100)-surface of the wafer 1 and such that the distance between two opposing walls 11a is greatest at the upper surface of the wafer 1 and decreases toward the lower surface of the wafer 1 (that is, the through-holes 11 are tapered).

Thus, the open end, on the upper side of the thin portion 13, of each through-hole 11 has a rectangular shape with a size substantially equal to the size of the corresponding opening 21 formed in the silicon oxide layer 2, and the open end, on the lower side of the thin portion 13, of each through-hole 11 has a rectangular shape with a size smaller than the size of the open end on the upper side.

The silicon oxide layer 2 is then removed by soaking the wafer 1 in an aqueous solution of a hydrofluoric acid-base etchant. FIG. 3(c) shows the structure obtained at this stage of the process.

A silicon oxide layer 3 with a uniform thickness is then formed such that the entire surface of the silicon wafer 1, including the walls 11a of the respective through-holes 11 and the bottom of the recessed portion 12, is covered with the silicon oxide layer 3. The silicon oxide layer 3 may be formed by thermal oxidation. FIG. 3(d) shows the structure obtained at this stage of the process.

Thus, a mask is obtained which is made of single crystal silicon such that the mask surface is formed by a (100)-surface of the single crystal silicon, each through-hole 11 formed in the thin portion 12 formed in the center of the mask surface has walls oriented in (111)-directions, and the raised portion 14 is formed in the peripheral area on the same side as that at which each through-hole 11 has a smaller aperture size than at the opposite side.

Because this mask is made of single crystal silicon, even when the mask thickness and the opening-to-opening distance are small, the mask can be handled without causing bending or deformation. Bending does not occur even if no tensile force is applied during the layer formation process. The openings can be formed with high enough precision to form high-precision pixels.

Because the each through-hole 11 formed by the present method has a tapered structure, if the mask is placed such that a mask surface at which each through-hole 11 has a smaller aperture size than at the opposite surface is brought into proximity to a substrate surface on which a thin-layer pattern is to be formed, it is possible to prevent the resultant thin-layer pattern from becoming thin at its edge.

In order to use the mask in the above-described manner, the size of the smaller opening end of each through-hole 11 should correspond to the size of the thin-layer pattern to be formed. Because the size of the smaller opening end is determined by the size of the corresponding opening 21 formed in the silicon oxide layer 2 and by the thickness of the thin portion 13, the size of the opening 21 formed in the silicon oxide layer 2 should be determined, taking into account the thickness of the thin portion 13, such that the size of the thin-layer pattern to be formed corresponds to the size of the open end of the corresponding through-hole 11.

As with the mask according to the first embodiment, the mask according to the present embodiment does not necessarily need to have the silicon oxide layer 3. That is, the final structure of the mask may exclude the silicon oxide layer 3 and be similar to that shown in FIG. 3(c). Furthermore, the raised portion 14 may or may not be removed. In the case where some or entire raised portion 14 is left, the thickness or the shape of the raised portion 14 may be adapted to support a substrate on which the thin layer pattern is to be formed. Even in the case where the raised portion 14 is finally removed, the raised portion 14 serves as a supporting portion during the process in which the mask is manufactured.

In the mask manufactured according to the present embodiment in which the through-holes 11 are formed in the thin portion 13, if the thickness of the thin portion 13 is set to be small enough, openings can be precisely formed in the mask such the size of each opening accurately corresponds to a fine thin-layer pattern. Thus fine opening precisely corresponding to the thin-layer pattern to be formed can be easily formed in the mask, even when a silicon wafer with a rather large thickness such as 500 μm is used.

Figure 4:
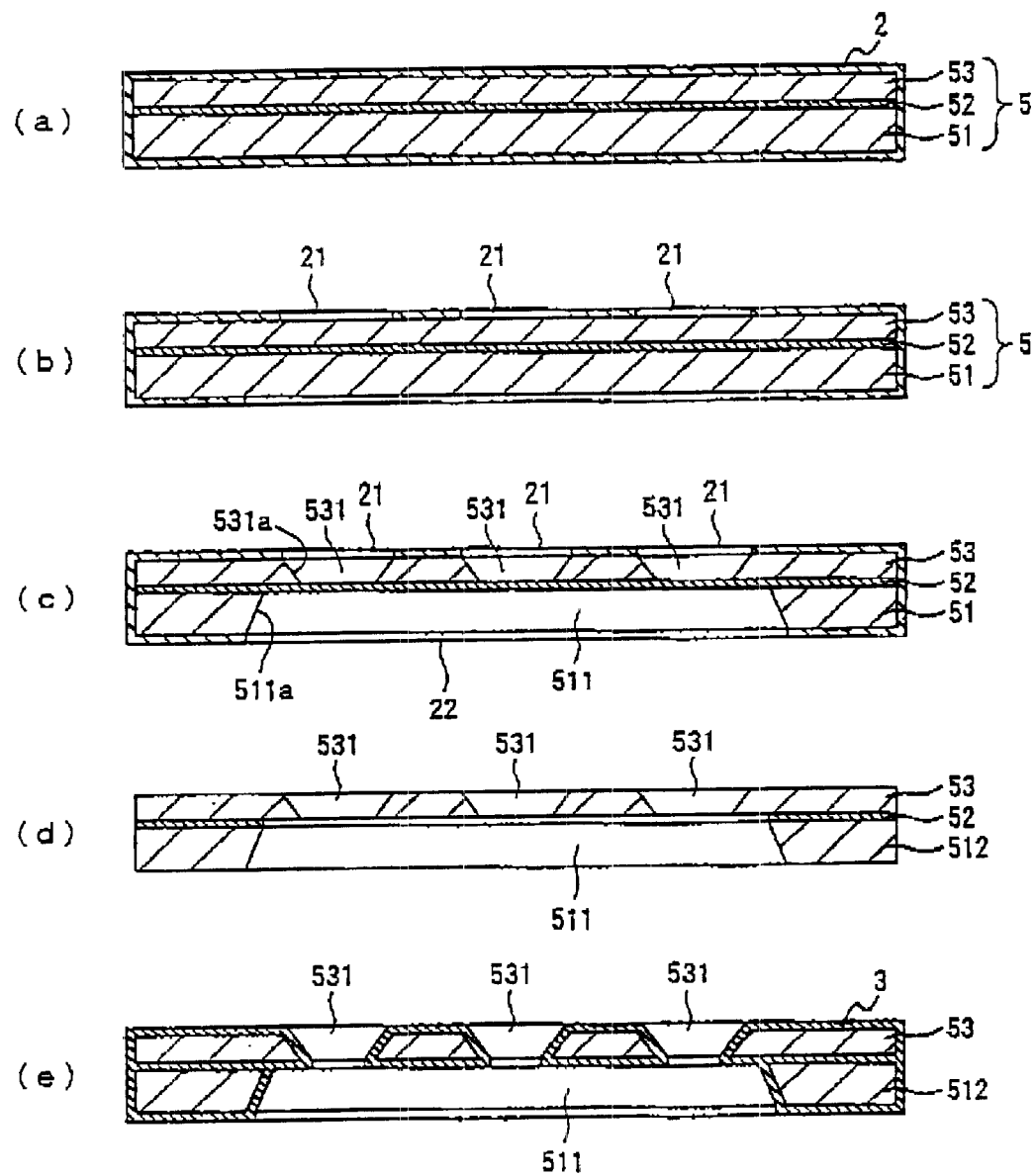
FIGS. 4(a) to 4(e) are diagrams illustrating a mask and a method of manufacturing the same according a third embodiment of the present invention.

A mask and a method of manufacturing the mask according to a third embodiment of the present invention are described below with reference to FIG. 4.

First, an SOI (Silicon On Insulator) substrate 5 composed of a single crystal silicon substrate 51 located at the bottom, a silicon oxide layer (insulating layer) 52 formed on the single crystal silicon substrate 51, and a single crystal silicon layer 53 formed on the silicon oxide layer 52 is prepared.

SOI substrates 5 having a single crystal silicon layer 53 with a thickness selected from a wide range can be commercially available. For example, the thickness of the single crystal silicon substrate 51 may be equal to 500 μm, the thickness of the silicon oxide layer 52 may be equal to 1 μm, and the thickness of the single crystal silicon layer 53 may be equal to 20 μm. A silicon oxide layer 2 is then formed over the entire surface of the SOI substrate 5 by a CVD technique. FIG. 4(*a*) shows the structure obtained at this stage of the process.

Thereafter, by using a combination of a photolithographic process and a dry etching process, a plurality of square-shaped openings 21 corresponding to apertures to be manufactured are formed in the silicon oxide layer 2 on the single crystal silicon layer 53 and an opening 22 is formed in the silicon oxide layer 2 on the silicon substrate 51 such that the surface of the silicon substrate 51 is exposed via the opening 22 except for a peripheral area. FIG. 4(*b*) shows the structure obtained at this stage of the process.

The SOI substrate 5 is then soaked in an aqueous solution of potassium hydroxide for a predetermined time so that the silicon surface exposed via the openings 21 and the silicon surface exposed via the opening 22 are anisotropically wet-etched using etching property dependence on the crystal orientation. The time during which the SOI substrate 5 is soaked in the aqueous solution of potassium hydroxide is determined so that the exposed portions of the single crystal silicon substrate 51 are entirely etched in the thickness direction, and thus through-holes 51*a* are formed in the single crystal silicon substrate 51.

As a result, a through-hole 511 having a tapered shape whose walls 511*a* are oriented in (111)-directions is formed in the single crystal silicon substrate 51, at a location corresponding to the opening 22, and through-holes 531 having a tapered shape whose walls 531*a* are oriented in (111)-directions are formed in the single crystal silicon layer 53, at locations corresponding to the openings 21. The peripheral portion of the single crystal silicon substrate 51 remains without being etched, and thus a raised portion 512 is formed. FIG. 4(*c*) shows the structure obtained at this stage of the process.

In order to use the resultant structure as a mask in such a manner that the mask is placed such that the silicon oxide layer 52 on the single crystal silicon layer 53 is brought into proximity to a surface of a substrate on which a thin-layer pattern is to be formed, it is required that the aperture size of each through-hole 531 at a boundary with the silicon oxide layer 52 should correspond to the thin-layer pattern to be formed. Because the apertures size of each through-hole 531 is determined by the size of the corresponding opening 21 formed in the silicon oxide layer 2 and by the thickness of the single crystal silicon layer 53, it is required that the size of each opening 21 formed in the silicon oxide layer 2 should be determined taking into account the thickness of the single crystal silicon layer 53 so that the aperture size of each through-hole 531 at the boundary with the silicon oxide layer 52 corresponds to the thin-layer pattern to be formed.

The silicon oxide layer 2 and the portion of the silicon oxide layer 52 exposed through the through-hole 511 are then removed by soaking the SOI substrate 5 in an aqueous solution of a hydrofluoric acid-base etchant. FIG. 4(*d*) shows the structure obtained at this stage of the process.

A silicon oxide layer 3 with a uniform thickness is then formed such that the entire surface of the SOI substrate 5, including the walls 511*a* and 531*a* of the respective through-holes 511 and 531, is covered with the silicon oxide layer 3. The silicon oxide layer 3 may be formed by thermal oxidation. FIG. 4(*e*) shows the structure obtained at this stage of the process.

Thus, a mask is obtained which is made of single crystal silicon such that a mask surface is formed by a (100)-surface of the single crystal silicon, the mask has apertures formed by the through-holes 531 whose walls are oriented in (111)-directions and which are formed in the thin portion (that remains after etching the single crystal silicon substrate 51) in the center of the mask, and the raised portion 512 is formed on the same side as that where the through-holes 531 have smaller aperture sizes than on the opposite side.

Because this mask is made of single crystal silicon, even when the mask thickness and the opening-to-opening distance are small, the mask can be handled without causing bending or deformation. Bending does not occur even if no tensile force is applied during the layer formation process. The openings can be formed with high enough precision to form high-precision pixels.

Furthermore, because the apertures are formed by the tapered through-holes 531, if the mask is placed such that a mask surface at which the through-holes 531 have smaller aperture sizes than at the opposite surface is brought into proximity to a substrate on which the thin-layer pattern is to be formed, it is possible to prevent an edge portion of the resultant thin-layer pattern from becoming thinner than the main portion thereof.

As with the mask according to the first embodiment, the mask according to the present embodiment does not necessarily need to have the silicon oxide layer 3. That is, the final structure of the mask need not include the silicon oxide layer 3 and be similar to that shown in FIG. 4(*d*). Furthermore, the raised portion 512 may or may not be entirely or partially removed. In the case where some or entire raised portion 512 is left, the thickness or the shape of the raised portion 512 may be adjusted so as to support a substrate on which the thin layer pattern is to be formed. Even in the case where the raised portion 512 is finally removed, the raised portion 14 serves as a supporting portion during the process in which the mask is manufactured.

In the mask manufactured according to the present embodiment, the apertures corresponding to the thin-layer pattern to be formed are formed by the through-holes 531 formed in the single crystal silicon layer 53 of the SOI substrate 5, and thus, if the single crystal silicon layer 53 of the SOI substrate 5 is thin enough, it is possible to realize apertures so as to precisely correspond to the thin-layer pattern to be formed even when the thin-layer pattern has a very small size.

Figure 5:
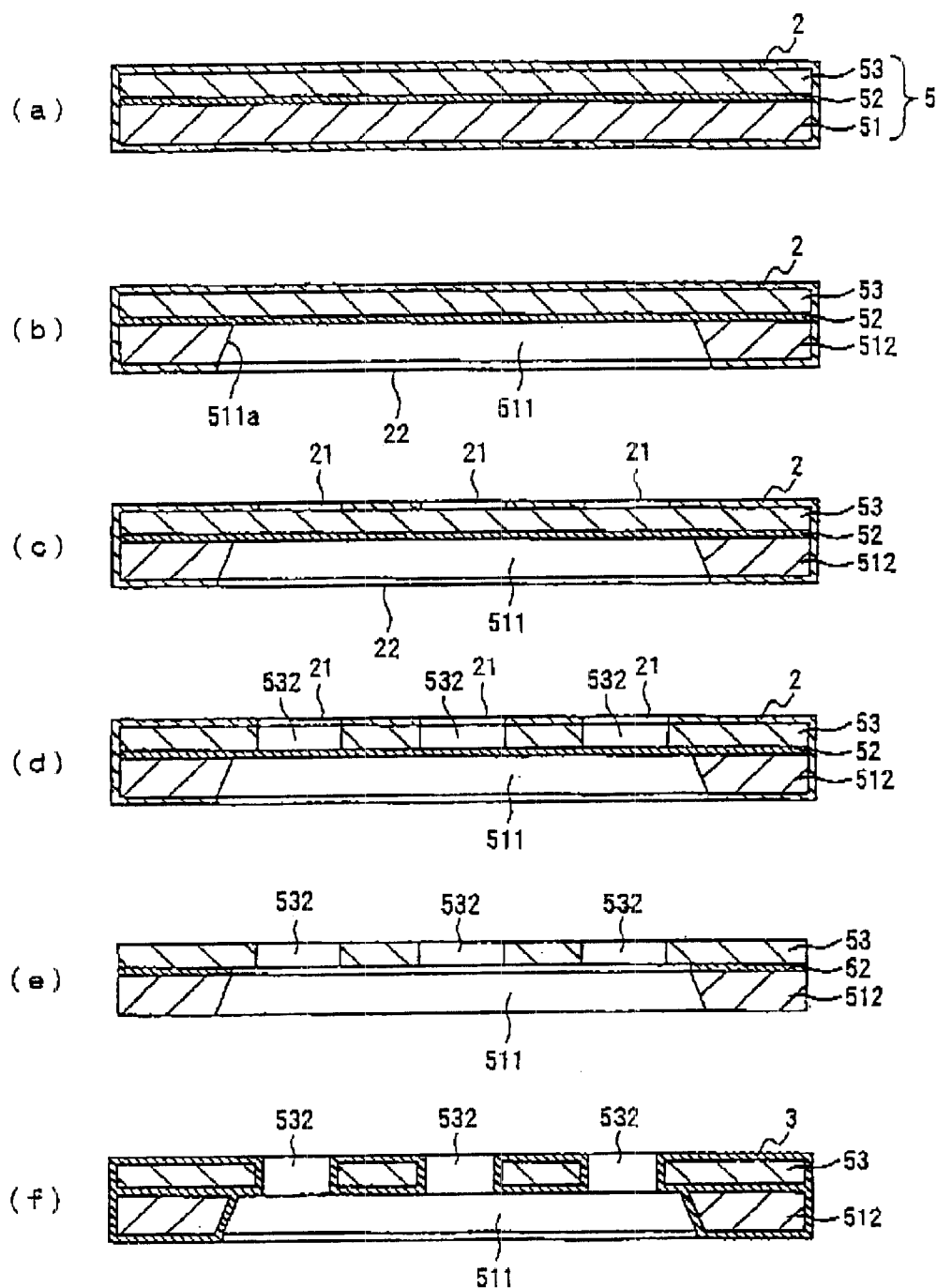
FIGS. 5(a) to 5(f) are diagrams illustrating a mask and a method of manufacturing the same according a fourth embodiment of the present invention.

A mask and a method of manufacturing it according to a fourth embodiment of the present invention are described below with reference to FIG. 5.

First, as in the third embodiment described above, an SOI (Silicon On Insulator) substrate 5 composed of a single crystal silicon substrate 51 located at the bottom, a silicon oxide layer (insulating layer) 52 formed on the single crystal silicon substrate 51, and a single crystal silicon layer 53 formed on the silicon oxide layer 52 is prepared. A silicon oxide layer 2 is then formed over the entire surface of the SOI substrate 5. FIG. 5(*a*) shows the structure obtained at this stage of the process.

Thereafter, by using a combination of a photolithographic process and a dry etching process, an opening 22 can be formed in the silicon oxide layer 2 on the single crystal silicon substrate 51 such that the surface of the single crystal silicon substrate 51 is exposed via the opening 22 except for a peripheral area. The SOI substrate 5 is then soaked in an aqueous solution of potassium hydroxide for a predetermined time so that the portion of the single crystal silicon substrate 51 exposed via the opening 22 is anisotropically wet-etched using etching property dependence on the crystal orientation so that a through-hole 511 having walls 511a oriented in (111)-directions is formed in the single crystal silicon substrate 51. A peripheral portion of the single crystal silicon substrate 51 remains without being etched, and thus a raised portion 512 is formed. FIG. 5(b) shows the structure obtained at this stage of the process.

Thereafter, by using a combination of a photolithographic process and a dry etching process, a plurality of square-shaped openings 21 corresponding to apertures to be manufactured are formed in the silicon oxide layer 2 on the single crystal silicon layer 53. FIG. 5(c) shows the structure obtained at this stage of the process.

Thereafter, by ICP-RIE (Inductively Coupled Plasma Reactive Ion Etching) technique, portions of the single crystal silicon layer 53 exposed via the openings 21 are anisotropically dry-etched under a proper etching condition so that through-holes 532 are formed in the single crystal silicon layer 53, at locations corresponding to the openings 21. The cross section, taken at any position in the depth direction, of each resultant through-hole 532 has a square shape equal in size to the corresponding opening 21 formed in the silicon oxide layer 2. FIG. 5(d) shows the structure obtained at this stage of the process.

In the present embodiment, the size of each square-shaped opening 21 formed in the silicon oxide layer 2 is selected so as to correspond to a square of a thin-layer pattern to be formed. The technique according to the present embodiment may also be employed when the thin-layer pattern to be formed has an arbitrary shape other than a square or a rectangle.

Thereafter, the silicon oxide layer 2 and the portion of the silicon oxide layer 52 exposed via the through-hole 511 are removed by performing a process, similar to that employed in the third embodiment, on the SOI substrate 5. FIG. 5(e) shows the structure obtained at this stage of the process.

A silicon oxide layer 3 with a uniform thickness is then formed in a similar manner to the third embodiment such that the entire surface of the SOI substrate 5, including the walls 511a of the through-hole 511 and the walls of the through-holes 532, is covered with the silicon oxide layer 3. FIG. 5(e) shows the structure obtained at this stage of the process.

Thus, a mask is obtained which is formed of single crystal silicon so as to have apertures formed by through-holes 532 whose size is content along the whole thickness and have the raised portion 512 in the peripheral area.

Because this mask is made of single crystal silicon, even when the mask thickness and the opening-to-opening distance are small, the mask can be handled without causing bending or deformation. Bending does not occur even if no tensile force is applied during the layer formation process. The openings can be formed with high enough precision to form high-precision pixels.

In the mask manufactured according to the present embodiment, the apertures corresponding to the thin-layer pattern to be formed are formed by the through-holes 531 formed in the single crystal silicon layer 53 of the SOI substrate 5, and thus, if the single crystal silicon layer 53 of the SOI substrate 5 is selected to be thin enough, it is possible to easily obtain apertures that precisely correspond to the thin-layer pattern to be formed even when the thin-layer pattern has a very small size. Furthermore, as in the third embodiment, the raised portion 512 may be used in a practically effective fashion.

In the technique according to the present embodiment, because the through-holes 532 for forming the apertures are manufactured by means of dry etching, the technique may also be employed when the thin-layer pattern to be formed has a shape other than a square or a rectangle.

The mask according to the present embodiment does not necessarily need to have the silicon oxide layer 3. That is, the final structure of the mask may exclude the silicon oxide layer 3 and be similar to that shown in FIG. 5(e). Also in this case, by forming the openings 21 in the silicon oxide layer 2 such that the openings 21 become the same in shape and size as the thin-layer pattern to be formed, the through-holes 532 serving as apertures can be easily obtained which are the same in shape and size as the thin-layer pattern to be formed.

Figure 6:
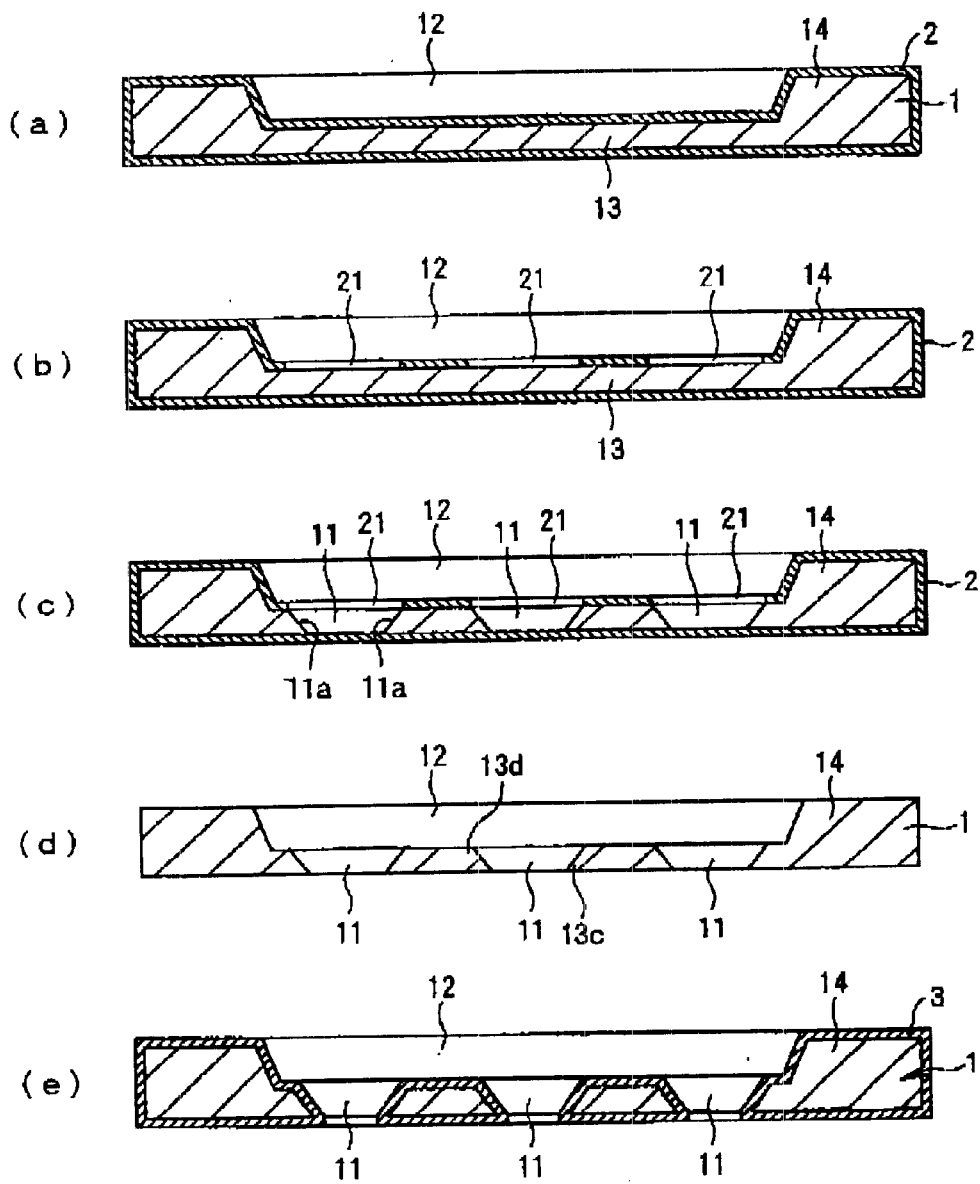
FIGS. 6(a) to 6(e) are diagrams illustrating a mask and a method of manufacturing the same according a fifth embodiment of the present invention.

A mask and a method of manufacturing it according to a fifth embodiment of the present invention are described below with reference to FIG. 6.

In this embodiment, as in the second embodiment, a structure such as that shown in FIG. 6(a) is formed via process steps shown in FIGS. 2(a) to 2(d). Thereafter, square-shaped openings 21 corresponding to apertures to be formed are formed in the silicon oxide layer 2 on the same side of the thin portion 13 as the raised portion 12. FIG. 6(b) shows the structure obtained at this stage of the process.

The wafer 1 is then soaked in an aqueous solution of potassium hydroxide for a predetermined time so that the silicon surface exposed via the openings 21 is anisotropically wet-etched using etching property dependence on the crystal orientation. As a result, through-holes 11 each having (111)-oriented walls 11a are formed in the wafer 1, at locations corresponding to the openings 21. FIG. 6(c) shows the structure obtained at this stage of the process.

The silicon oxide layer 2 is then removed by performing a process, similar to that employed in the second embodiment, on the wafer 1. FIG. 6(d) shows the structure obtained at this stage of the process. A silicon oxide layer 3 with a uniform thickness is then formed in a similar manner to the second embodiment such that the entire surface of the wafer 1, including the walls 11a of the respective through-holes 11 and the bottom of the recessed portion 12, is covered with the silicon oxide layer 3. FIG. 6(e) shows the structure obtained at this stage of the process.

Thus a mask is obtained which is similar in structure to the mask according to the second embodiment described above except that the raised portion 14 is located on the same side as that where the through-holes 11 have greater aperture sizes than on the opposite side.

A mask having a structure similar to that obtained in this embodiment can also be manufactured using an SOI substrate. In this case, an SOI substrate 5 similar to that used in the third embodiment may be employed. After anisotropically wet-etching the single crystal silicon substrate 51 such that a peripheral portion 512 remains, openings 21 are formed in the silicon oxide layer 52, and through-holes 531 are formed in the single crystal silicon layer 53, at locations corresponding to the openings 21, by means of anisotropic wet etching.

Figure 7:
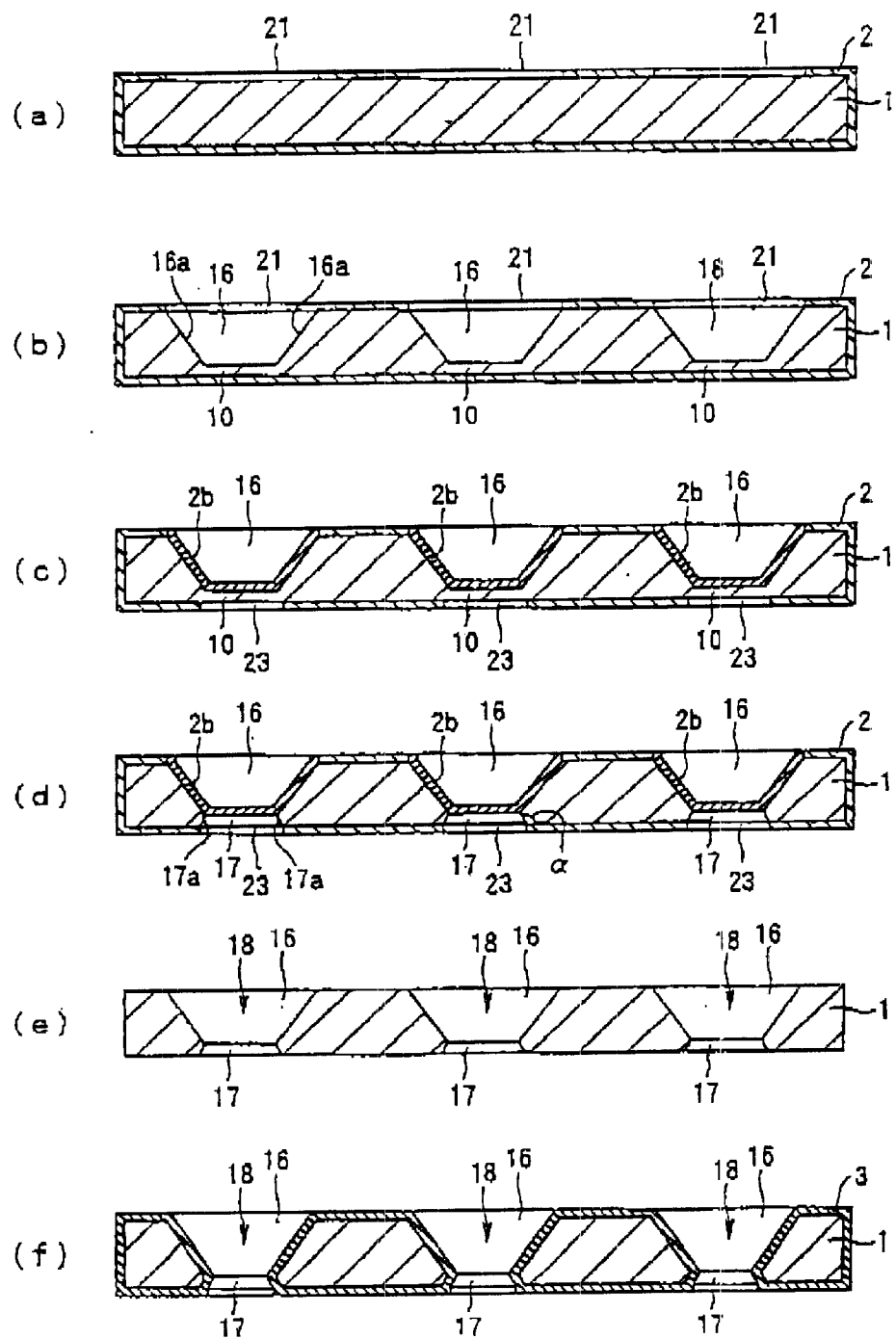
FIGS. 7(a) to 7(f) are diagrams illustrating a mask and a method of manufacturing the same according a sixth embodiment of the present invention.

A mask and a method of manufacturing it according to a sixth embodiment of the present invention are described below with reference to FIG. 7.

In this embodiment, as in the first embodiment described above, a silicon oxide layer 2 is first formed over the entire surface of a wafer 1, and then square-shaped openings 21 corresponding to mask apertures to be formed are formed in the silicon oxide layer 2 on the upper side. FIG. 7(a) shows the structure obtained at this stage of the process.

The wafer 1 is then soaked in an aqueous solution of potassium hydroxide for a predetermined time so that the silicon surface exposed via the openings 21 is wet-etched in a crystal orientation-dependent anisotropic fashion. Herein, the time during which the wafer 1 is soaked in the aqueous solution of potassium hydroxide is selected such that the wafer 1 is etched by a predetermined amount in the thickness direction (so that the portion remaining at the bottom of the recess formed by etching has a predetermined thickness equal to, for example, 1/20 times the original thickness). In this embodiment, unlike the first embodiment in which through-holes 11 are formed, recessed portions 16 having a tapered structure with (111)-oriented walls 16a are formed in the wafer 1, at locations corresponding to the openings 21, and silicon 10 remains below each recessed portion 16. FIG. 7(b) shows the structure obtained at this stage of the process.

Thereafter, a silicon oxide layer 2b is formed such that the walls and the bottom of each recessed portion 16 are covered with the silicon oxide layer 2b, and openings 23 are formed in the silicon oxide layer 2 on the lower side (opposite to the side where the openings 21 are formed) such that the opening 23 has a square shape smaller in size than the corresponding openings 21 and such that the center of each opening 23 becomes coincident with the center of the corresponding opening 21. FIG. 7(c) shows the structure obtained at this stage of the process.

The wafer 1 is then soaked in an aqueous solution of potassium hydroxide for a predetermined time so that the silicon 10 exposed via the openings 23 is anisotropically wet-etched in (111)-directions until the silicon oxide layer 2b is exposed. As a result, tapered holes 17 with (111)-oriented walls 17a are formed in the wafer 1, at locations corresponding to the openings 23. The walls of each hole 17 are tapered in opposite directions to directions in which the walls of the corresponding recessed portion 16 are tapered. FIG. 7(d) shows the structure obtained at this stage of the process.

Thereafter, the silicon oxide layers 2 and 2b are removed by a process similar to that employed in the first embodiment so that each hole 17 communicate with the corresponding recessed portion 16 thereby forming through-holes 18 serving as apertures. FIG. 7(e) shows the structure obtained at this stage of the process.

In order to use the resultant structure as a mask in such a manner that the mask is placed such that the lower side (where the holes 17 of the through-holes 18 are located) of the wafer is brought into proximity to a substrate surface on which a thin-layer pattern is to be formed, it is required that the size of each opening 23 that determines the size of the corresponding hole 17 should correspond to the thin-layer pattern to be formed. Preferably, the size of each opening 23 is determined so that the hole 17 and the corresponding recessed portion 16 become equal in size at the boundary between the hole 17 and the corresponding recessed portion 16.

A silicon oxide layer 3 with a uniform thickness is then formed in a similar manner to the first embodiment such that the entire surface of the silicon wafer 1, including the walls of the respective through-holes 18, is covered with the silicon oxide layer 3. FIG. 7(f) shows the structure obtained at this stage of the process.

Thus, a mask is obtained which is made of single crystal silicon so as to have a mask surface formed by a (100)-surface of the single crystal silicon and have apertures with walls oriented in (111)-directions formed by through-holes 18. In this mask, an open end portion, to be located in proximity to the substrate on which the thin-layer pattern is to be formed, of each through-hole 18 is tapered at an obtuse angle a.

Therefore, the mask manufactured according to the present embodiment has, in addition to the advantages similar to those of the mask according to the first embodiment, an advantage that an edge portion of each through-hole 18 on the side to be brought in proximity to the substrate on which the thin-layer pattern is to be formed is prevented from being easily broken.

The mask according to the present embodiment does not necessarily need to have the silicon oxide layer 3. That is, the final structure of the mask may be similar to that shown in FIG. 7(e).

A first embodiment of a method of manufacturing an organic EL device according to the present invention is described below with reference to FIG. 8.

In this embodiment, by way of example, a process step of forming R (red), G (green), and B (blue) luminescent layers in pixels by vacuum evaporation, included in a process of manufacturing a full-color active matrix organic EL display device, is described. Herein, it is assumed that, before this step, the steps of forming transistors and capacitors of respective pixels, interconnections among them, a driving circuit, and other necessary elements on a glass substrate, forming a transparent electrode on each pixel, and, if necessary, forming a hole transportation/injection layer on each transparent electrode have been performed.

After performing the above-described steps in a known manner, the glass substrate 6 is placed on a substrate holder 7 in a vacuum evaporator, and a mask 9 is placed thereon via a mask holder 8.

In this display device to be manufactured, pixels are arranged at regular intervals in the order of R, G, B, R, G, B, and so on in a direction parallel with a side of the glass substrate. The mask 9 has as many apertures 91 as there are sets of R, G, and B pixels, wherein the apertures 91 are formed at locations corresponding to the respective sets of R, G, and B pixels.

The mask 9 maybe formed of single crystal silicon so as to have a mask surface formed by a (100)-surface of the single crystal silicon and have apertures 91 formed by tapered through-holes with (111)-oriented walls. Such a mask may be manufactured in accordance with one of the embodiments described above (other than the fourth embodiment). However, in the present embodiment, the raised portion in the peripheral area of the mask is removed.

The mask holder 8 has the form of a frame. A peripheral area with a predetermined width on the glass substrate, outside an area in which a thin layer is to be formed, is covered by the frame-shaped mask holder 8. The thickness of the mask holder 8 is selected to be equal to the sum of the thickness of the thin layer to be formed and the gap between the mask and the thin layer (for example, the thickness of the mask holder 8 is selected to be 2 μm). The mask 9 is placed on the mask holder 8 such that a mask surface at which the apertures 91 are smaller than at the opposite surface is brought into proximity to the glass substrate (on which the thin layer is to be formed).

Thereafter, the mask position is adjusted so that the mask apertures 91 come to locations where R pixels are to be formed, and a target material for forming an R (red) luminescent layer is evaporated. As a result, a red luminescent layer 61 is formed on the glass substrate 6, at locations of R pixels. FIG. 8(a) shows the structure obtained at this stage of the process.

Thereafter, the mask 9 is displaced in a horizontal direction by a distance corresponding to one pixel so that the apertures 91 come to locations of G pixels adjacent to the R pixels, and a target material for forming a G (green) luminescent layer is evaporated. As a result, a green luminescent layer 62 is formed on the glass substrate 6, at locations of G pixels. FIG. 8(b) shows the structure obtained at this stage of the process.

Thereafter, the mask 9 is further displaced in the horizontal direction by a distance corresponding to one pixel so that the apertures 91 come to locations of B pixels adjacent to the G pixels and a target material for forming a B (blue) luminescent layer is evaporated. As a result, a blue luminescent layer 63 is formed on the glass substrate 6, at locations of B pixels. FIG. 8(c) shows the structure obtained at this stage of the process.

After forming the luminescent layers, the following steps of forming a cathode layer and other necessary elements are performed according to a known method so as to obtain a full-color active matrix organic EL display device.

In the present embodiment, because the mask 9 can be formed of single crystal silicon so that the apertures 91 precisely correspond to pixels with a very small size, the resultant full-color active matrix organic EL display device has high-precision pixels.

Furthermore, because the mask 9 having apertures 91 formed by the tapered through-holes is placed in the above-described manner, each luminescent layer is prevented from becoming thin at pattern edges. Thus, good uniformity of the luminescent intensity of the pixels is obtained over the entire surface of the glass substrate 6.

A second embodiment of a method of manufacturing an organic EL device according to the present invention is described below with reference to FIG. 9.

In this embodiment, different masks 9A, 9B, and 9C are used to form R, G, and B pixels. The mask 9A for forming R pixels has apertures 91A formed at locations corresponding to the locations of R pixels, the mask 9B for forming G pixels has apertures 91B formed at locations corresponding to the locations of G pixels, and the mask 9C for forming B pixels has apertures 91C formed at locations corresponding to the locations of B pixels. These masks 9A, 9B, and 9C are basically similar the mask 9 shown in FIG. 8 except that the apertures 91A to 91C are formed at different locations.

In the present embodiment, a glass substrate 6 is placed in a box-shaped substrate holder 71 having an inner depth greater than the thickness of the glass substrate 6 and a step serving as a mask supporting plane 72 is formed on the top surface of box wall. The mask supporting plane 72 is formed such that when the mask is placed thereon, a gap equal to the sum of the thickness of a thin layer to be formed and a gap between the surface of the thin layer and the mask surface is formed between the upper surface of the glass substrate 6 and the lower surface of the mask (for example, the gap is selected to be 18 µm).

First, the glass substrate 6 is placed in the substrate holder 71, and then the mask 9A for forming R pixels is placed on the mask holding plane 72. Thereafter, a target material for forming an R (red) luminescent layer is evaporated. As a result, a red luminescent layer 61 is formed on the glass substrate 6, at locations of R pixels. FIG. 9(a) shows the structure obtained at this stage of the process.

The mask 9A is removed, and the mask 9B is placed on the mask supporting plane 72. Thereafter, a target material for forming a G (green) luminescent layer is evaporated. As a result, a green luminescent layer 62 is formed on the glass substrate 6, at locations of G pixels. FIG. 9(b) shows the structure obtained at this stage of the process.

The mask 9B is removed, and the mask 9C is placed on the mask supporting plane 72. Thereafter, a target material for forming a B (blue) luminescent layer is evaporated. As a result, a blue luminescent layer 63 is formed on the glass substrate 6, at locations of B pixels. FIG. 9(c) shows the structure obtained at this stage of the process.

Figure 8:
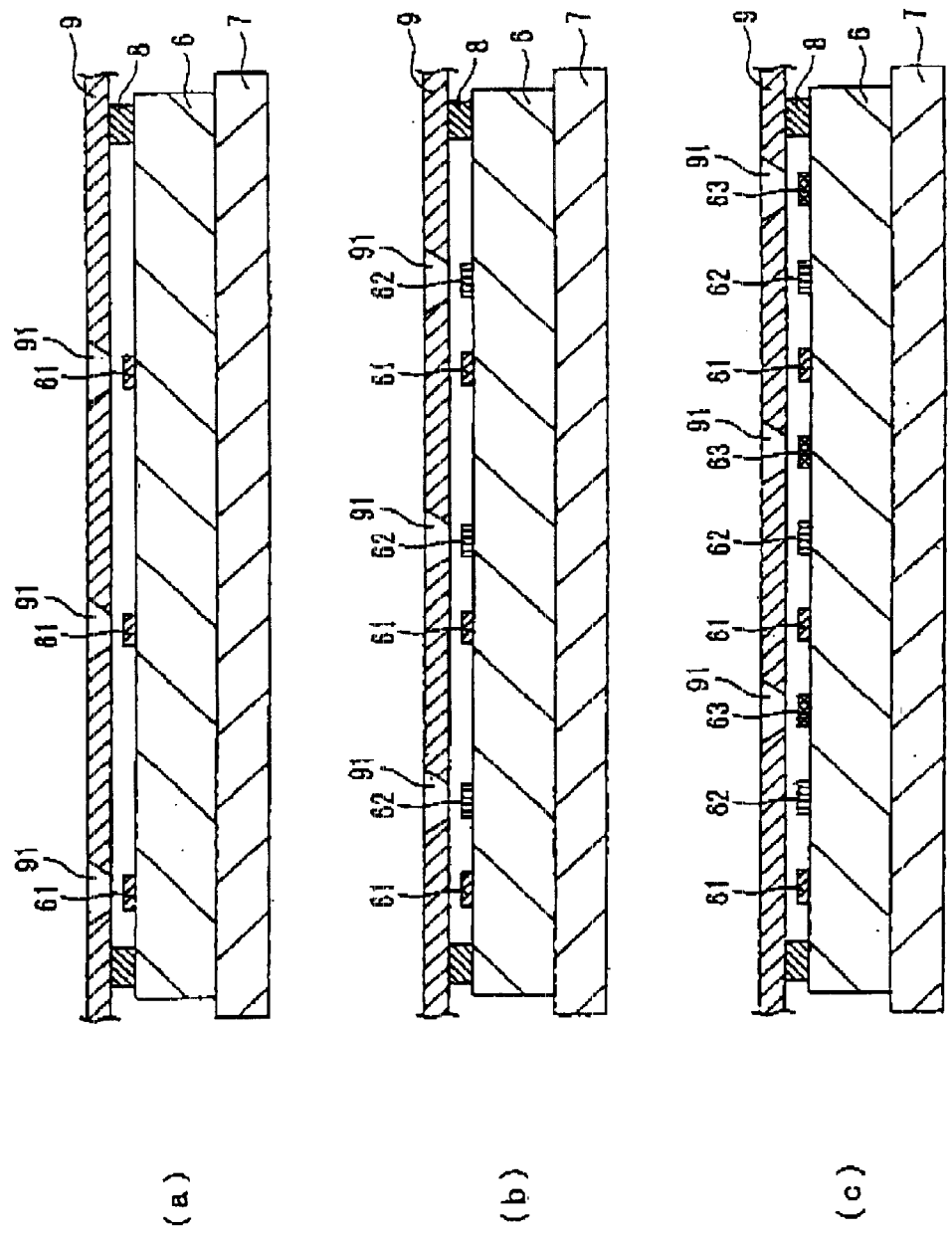
FIGS. 8(a) to 8(c) are diagrams illustrating a method of manufacturing an organic electroluminescence device according to an embodiment of the present invention.

In addition to the advantages obtained when the mask 9 shown in FIG. 8 is used, the method according to the present embodiment has a further advantage that R, G, and B pixels can be manufactured using the different masks 9A to 9C instead of moving the single mask, and thus the production process becomes simple compared with the process using only the mask 9 shown in FIG. 8.

Apertures formed by anisotropically etching a single crystal silicon substrate or a single crystal silicon layer on an SOI substrate are so precise in size that size differences in apertures from mask to mask can be neglected. This means that a thin-layer pattern can be manufactured using different masks for different color pixels without causing a significant size difference among different color pixels.

Figure 9:
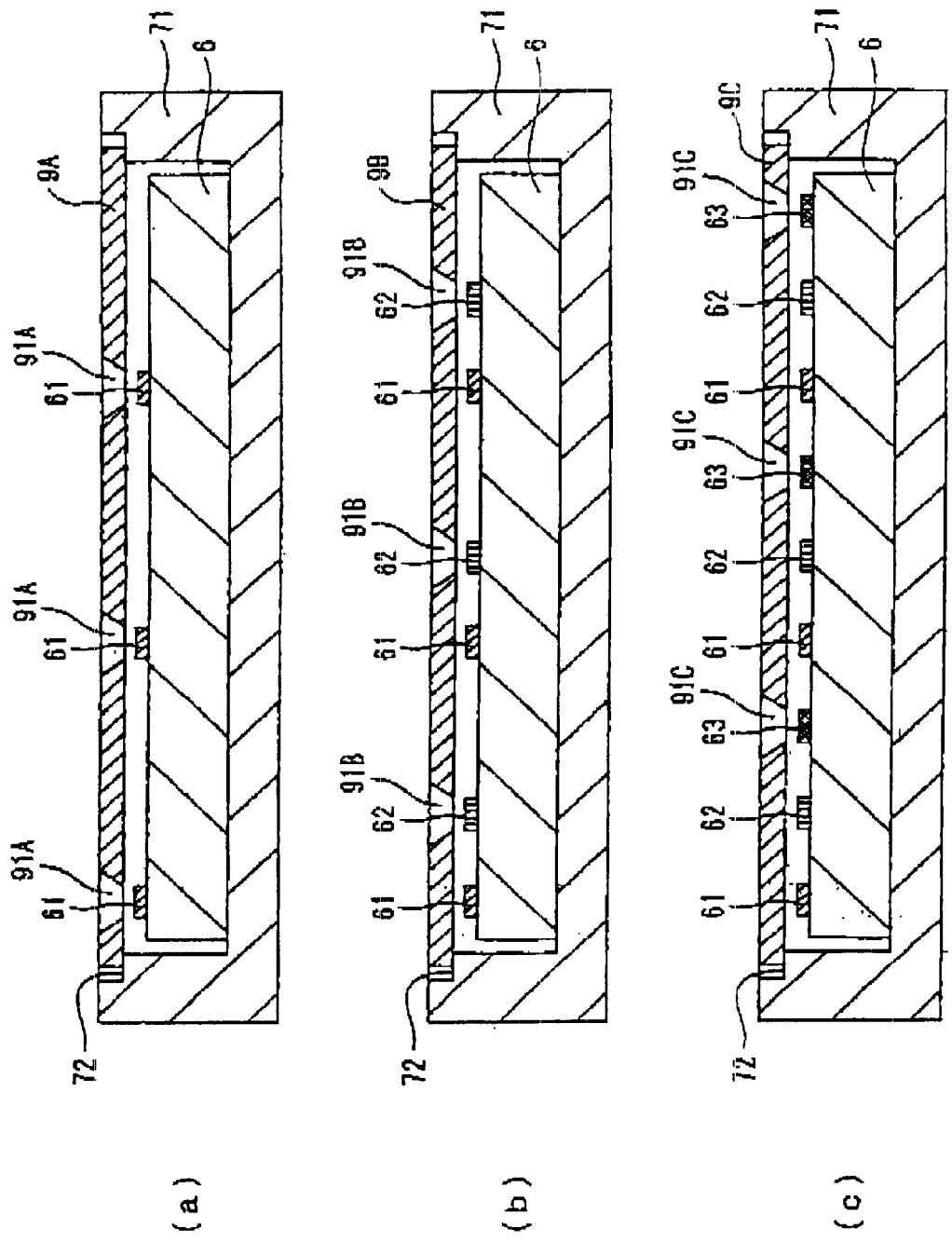
FIGS. 9(a) to 9(c) are diagrams illustrating a method of manufacturing an organic electroluminescence device according to another embodiment of the present invention.

In the embodiments shown in FIGS. 8 and 9, the raised portion 14 or 512 formed on the mask manufactured according to the second, third, or fifth embodiment is removed. However, in the case where the raised portion 14 or 512 is formed on the same side as the side where the through-holes 11 or 531 have smaller aperture sizes than on the opposite side as is in the mask according to the second or third embodiment, the raised portion 14 or 512 is located on the same side (back side of the mask) as that brought into proximity to a substrate surface on which a thin-layer pattern is to be formed, and the raised portion 14 or 512 may be used in an effective manner as described below with reference to FIGS. 10 and 11.

Figure 10:
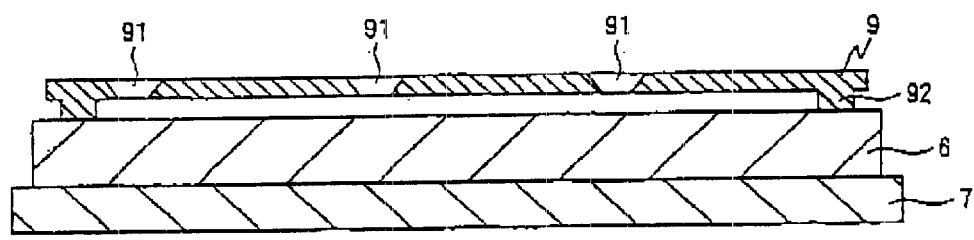
FIG. 10 is a cross-sectional view illustrating an example of a mask having a raised portion which is formed during a process of a mask and which is effectively used as a mask supporting portion during a process of manufacturing an organic electroluminescence device according to a method of the present invention.

In the example shown in FIG. 10, the raised portion formed in the peripheral area on the back side of the mask 9 is etched so as to have a shape similar to the mask holder 8 shown in FIG. 8 thereby allowing the raised portion to serve as the mask holder 92. That is, in this case, the mask holder 92 is formed in an integral fashion with the mask 9.

Figure 11:
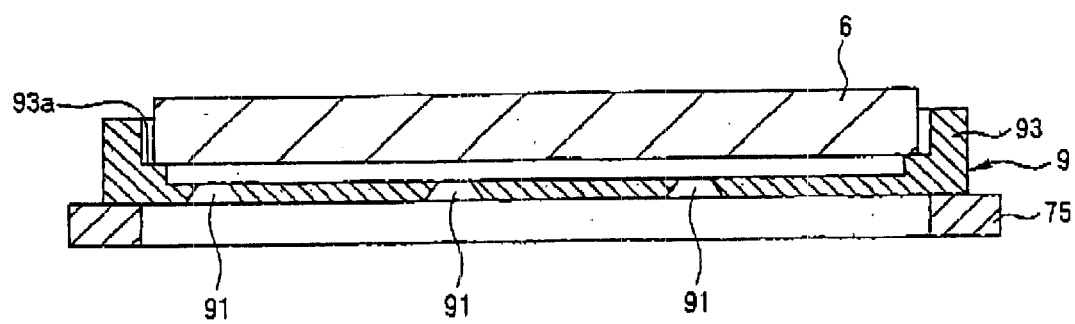
FIG. 11 is a cross-sectional view illustrating an example of a mask having a raised portion which is formed during a process of a mask and which is effectively used as a substrate supporting portion during a process of manufacturing an organic electroluminescence device according to a method of the present invention.

In the example shown in FIG. 11, a stepped surface (substrate supporting plane) 93a for supporting the glass substrate 6 is formed on the raised portion 9 in the peripheral area on the back side of the mask. In this example, the glass substrate 6 is placed above the mask 9 by positioning the glass substrate 6 on the substrate supporting plane 93a of the mask 9), and a layer is deposited from below through the mask 9. In this case, therefore, the mask 9 is needed to be supported by a frame-shaped mask holder 75 such that the lower surface of the mask 9 is exposed except for the peripheral portion covered by the frame-shaped mask holder 75.

A seventh embodiment of a mask according to the present invention is described below with reference to FIG. 12.

FIG. 12(a) is a plan view of the mask according to the seventh embodiment of the present invention, and FIG. 12(b) is a cross-sectional view taken along a line B—B of FIG. 12(a).

This mask has a thin portion 13 formed in the center thereof and a raised portion (thick portion) 14 formed on the edge thereof, wherein apertures 110 are formed in the thin portion 13 while no mask apertures are formed in the raised portion 14. The apertures 110 are formed in the thin portion 13 by through-holes extending in a direction perpendicular to the mask surface. The size of each through-hole 110 is minimum at a predetermined position (at the boundary) C in the thickness direction of the mask and increases toward both mask surfaces. The shape of each aperture 110, in cross section parallel with the mask surface, is square over the entire thickness of the mask.

Each aperture 110 is formed by a first tapered hole 111 on the same side as the raised portion 14 and a second tapered hole 112 on the opposite side wherein the first and second tapered holes 111 and 112 communicate with each other and the first tapered hole 111 and the second tapered hole 112 are tapered in opposite directions. The aperture size W0, at the boundary C, of each aperture 110 is selected to be equal to the size of the thin-layer pattern to be formed, and the size W1 of the first tapered hole 111 at the mask surface and the size W2 of the second tapered hole 112 at the opposite mask surface are greater than the size W0 at the boundary C.

The first tapered hole 111 is formed by four walls 111a tapered at an acute angle θ1 (for example 54.74°) to the mask surface. The second tapered hole 112 is formed by four walls 112a tapered at an acute angle θ2 (for example 70°) to the mask surface. Thus, the angles of edges 13a and 13b of the apertures (that is, angles of the walls 1a and 112a with respect to the mask surface of the thin portion 13) are obtuse at both mask surfaces ($\alpha 1 < 90°$ and $\alpha 2 < 90°$).

The distance t1 from the boundary C to the mask surface on the same side as the raised portion 14 (that is, the depth of the first tapered hole 111) is different from the distance t2 from the boundary C to the mask surface on the side opposite to the raised portion 14 (that is, the depth of the second tapered hole 112). That is, because the mask is placed such that the mask surface opposite to the raised portion 14 is brought into proximity to a substrate on which a layer is to be formed, the distance t2 (depth of the second tapered hole 112) is set to be smaller than the distance t1. The smaller the depth (distance t2) of the tapered hole of each aperture on the side in proximity to the substrate on which the layer is to be formed, the more accurate the pattern size of the resultant thin layer.

The advantages of the mask according to the seventh embodiment compared with the mask according to the fifth embodiment shown in FIG. 6(d) are discussed below.

In the case of the mask according to the fifth embodiment, the angle of an edge portion of each aperture (that is, an angle between the wall 11a and a mask surface of the thin portion 13) is obtuse at the surface on the side of the recessed portion 12 and acute at the opposite surface.

If this mask is placed such that the side where the aperture edge angles are acute (the side where the apertures have smaller aperture sizes than on the opposite side) is brought into proximity to a substrate surface on which a thin-layer pattern is to be formed, it becomes possible to prevent the resultant thin-layer pattern from becoming thin at its edge, and thus the resultant thin-layer pattern has high size accuracy. However, a problem is that an acute edge 13c of each aperture is easily broken during the process. If the mask is placed such that the side where obtuse edges are located (where apertures have greater aperture sizes than on the opposite side) is brought into proximity to a substrate surface on which a thin-layer is to be formed, edges 13d of apertures not easily broken during the process because the edges 13d are obtuse. However, the resultant thin-layer pattern does not have high size accuracy, unless the thickness of the thin portion 13 is reduced to an extremely small level. The reduction in the thickness of the thin portion 13 to an extremely small level results in a reduction in the mechanical strength, and thus can cause the apertures 11 to be deformed.

In contrast, in the mask according to the seventh embodiment, the edges 13a and 13b of the apertures are obtuse at both mask surfaces, and thus the mask edges 13b are not easily broken even if the side where the second tapered holes 112 are located (the side where the distance to the boundary position C is smaller than the opposite side) is brought into proximity to a substrate surface on which a thin-layer pattern is to be formed. Furthermore, because each aperture 110 is formed of a first tapered hole 111 and a second tapered hole 112, the depth t2 of the second tapered hole 112 can be reduced to an extremely small level without having to reduce the thickness of the thin portion 13. This makes it possible to manufacture a thin-layer pattern having high size accuracy without causing a reduction in the mechanical strength of the thin portion 13 and thus it becomes possible to prevent edges of apertures from being broken during use.

Figure 13:
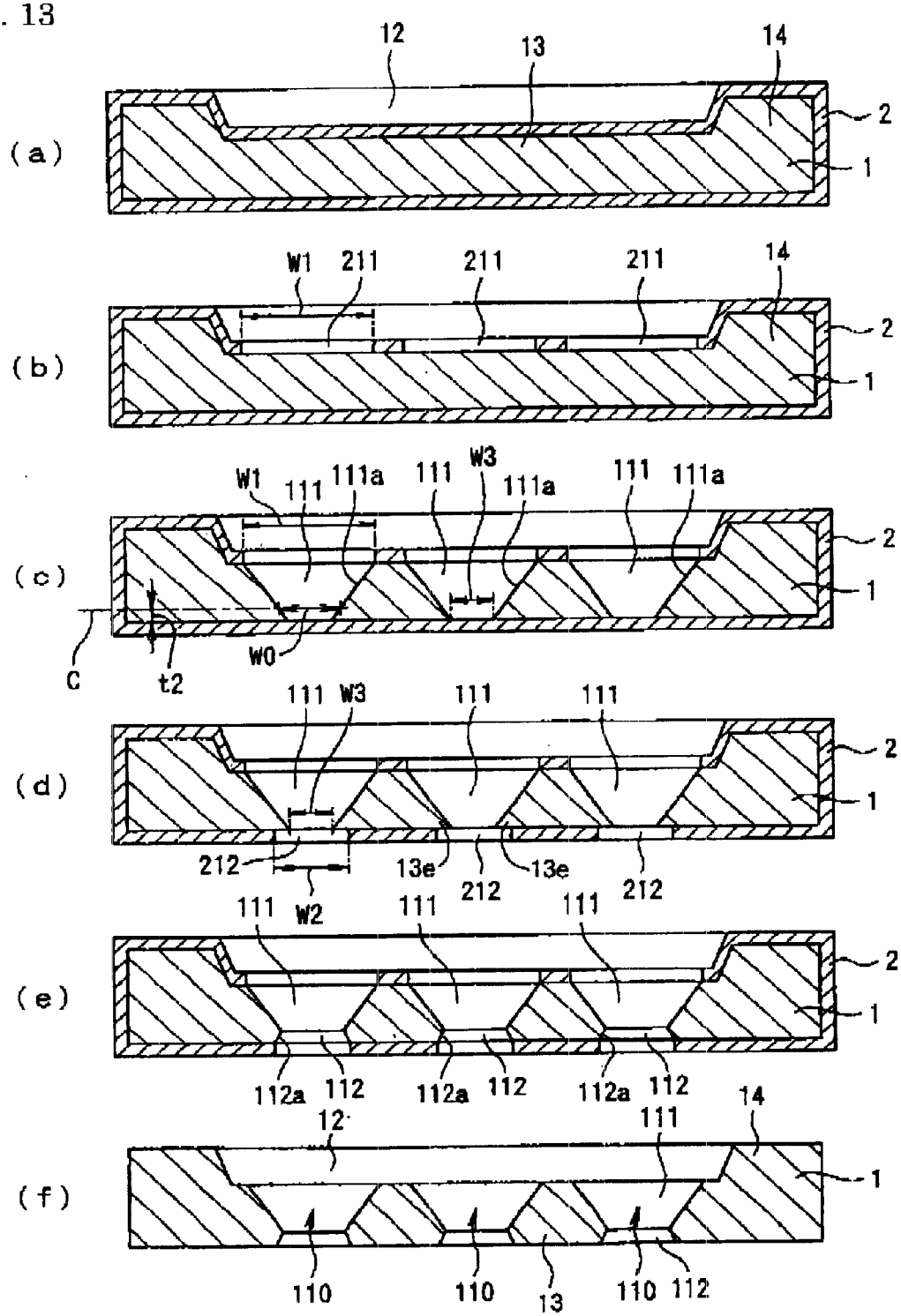
FIGS. 13(a) to 13(f) are diagrams illustrating a first method of manufacturing a mask according to the seventh embodiment of the present invention.

Examples of methods of manufacturing such a mask are described below. A first method is described first with reference to FIG. 13.

First, a structure similar to that shown in FIG. 13(a) is manufactured by performing steps similar to those shown in FIGS. 2(a) to 2(d) according to the second embodiment.

Thereafter, square-shaped openings 211 in the form of through-holes are manufactured in the silicon oxide layer 2 on the first surface (on the same side as that where the recessed portion 12 is formed) of the thin portion 13, at locations corresponding to the locations of apertures 110 such that the aperture size of each opening 211 will become equal to the size W1 of the corresponding first tapered hole 111 at the mask surface. FIG. 13(b) shows the structure obtained at this stage of the process.

The wafer 1 is then soaked in an aqueous solution of potassium hydroxide for a predetermined time so that the silicon surface exposed via the openings 211 is wet-etched in a crystal orientation-dependent anisotropic fashion. As a result, tapered through-holes (first tapered holes) 111 having (111)-oriented walls 111a are formed at locations corresponding to the openings 211. FIG. 13(c) shows the structure obtained at this stage of the process.

Thereafter, square-shaped openings 212 in the form of through-holes are manufactured in the silicon oxide layer 2 on the second surface (opposite to the first surface) of the thin portion 13, at locations corresponding to the locations of apertures 110 such that the aperture size of each opening 212 will become equal to the size W2 (<W0) of the corresponding second tapered hole 112 at the mask surface. FIG. 13(d) shows the structure obtained at this stage of the process.

The size W1 of the first tapered hole 111 at the first surface is determined taking into account the thickness of the thin portion 13 such that the size W0 of the aperture 110 at the boundary position C will become equal to the size of the thin-layer pattern to be formed. This means that, at the stage shown in FIG. 13(c), the size W3 of the first tapered hole 111 at the second surface is smaller than the size W0 at the boundary position C. In other words, at the stage of the process shown in FIG. 13(d), the edges 13e of the thin portion 13 are exposed via the openings 212 formed in the silicon oxide layer 2 formed on the second surface.

Thereafter, the wafer 1 is soaked in an aqueous solution of potassium hydroxide for a predetermined time so that the edges 13e of the thin portion 13 exposed via the openings 212 are wet-etched in a crystal orientation-dependent anisotropic fashion. As a result, second tapered holes 112 having walls 112a oriented in particular crystal orientation of the single crystal silicon are formed such that each second tapered holes 112 communicate with a corresponding first tapered hole 111. FIG. 13(e) shows the structure obtained at this stage of the process.

Note that, in this method, it is required that the soaking time should be precisely controlled such that the etching is ended at the boundary position C. Also note that the walls 112a formed by the present method are not necessarily oriented in (111) directions.

The silicon oxide layer 2 is then removed by performing a process, similar to that employed in the second embodiment, on the wafer 1. FIG. 13(f) shows the structure obtained at this stage of the process.

Figure 12:
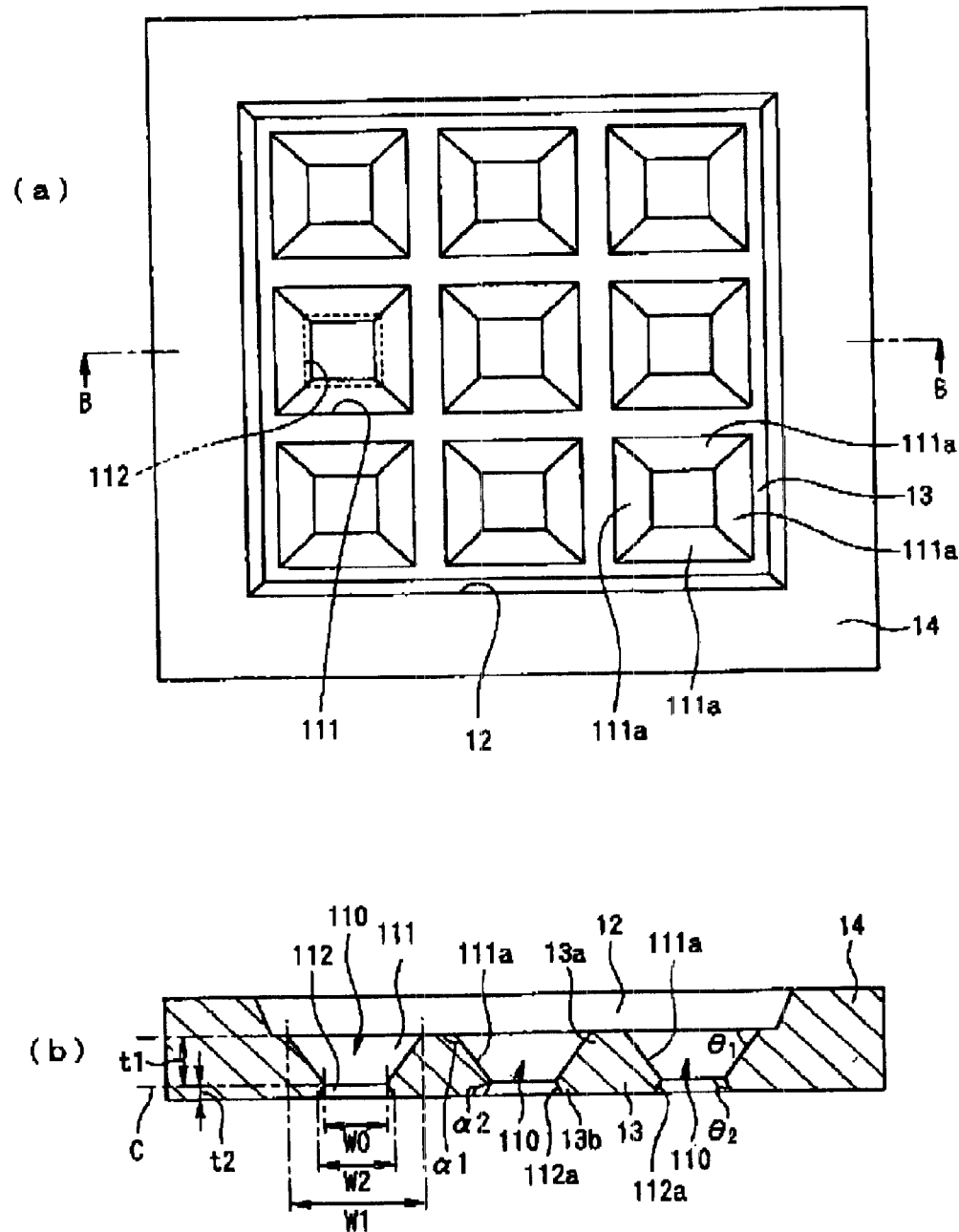
FIG. 12(a) is a plan view of a mask according to a seventh embodiment of the present invention.
FIG. 12(b) is a cross-sectional view taken along line B—B of FIG. 12(a)

The resultant mask obtained by the present method has a structure, such as that shown in FIG. 12, formed of single crystal silicon such that the mask surface is formed by a (100) surface of the single crystal silicon, each aperture 110 has two wall portions 111a and 112a that tapered in opposite directions and that expand toward respective mask surfaces opposite to each other, and at least the wall portion 111a of the first tapered hole 111 is oriented in a (111) direction.

Figure 14:
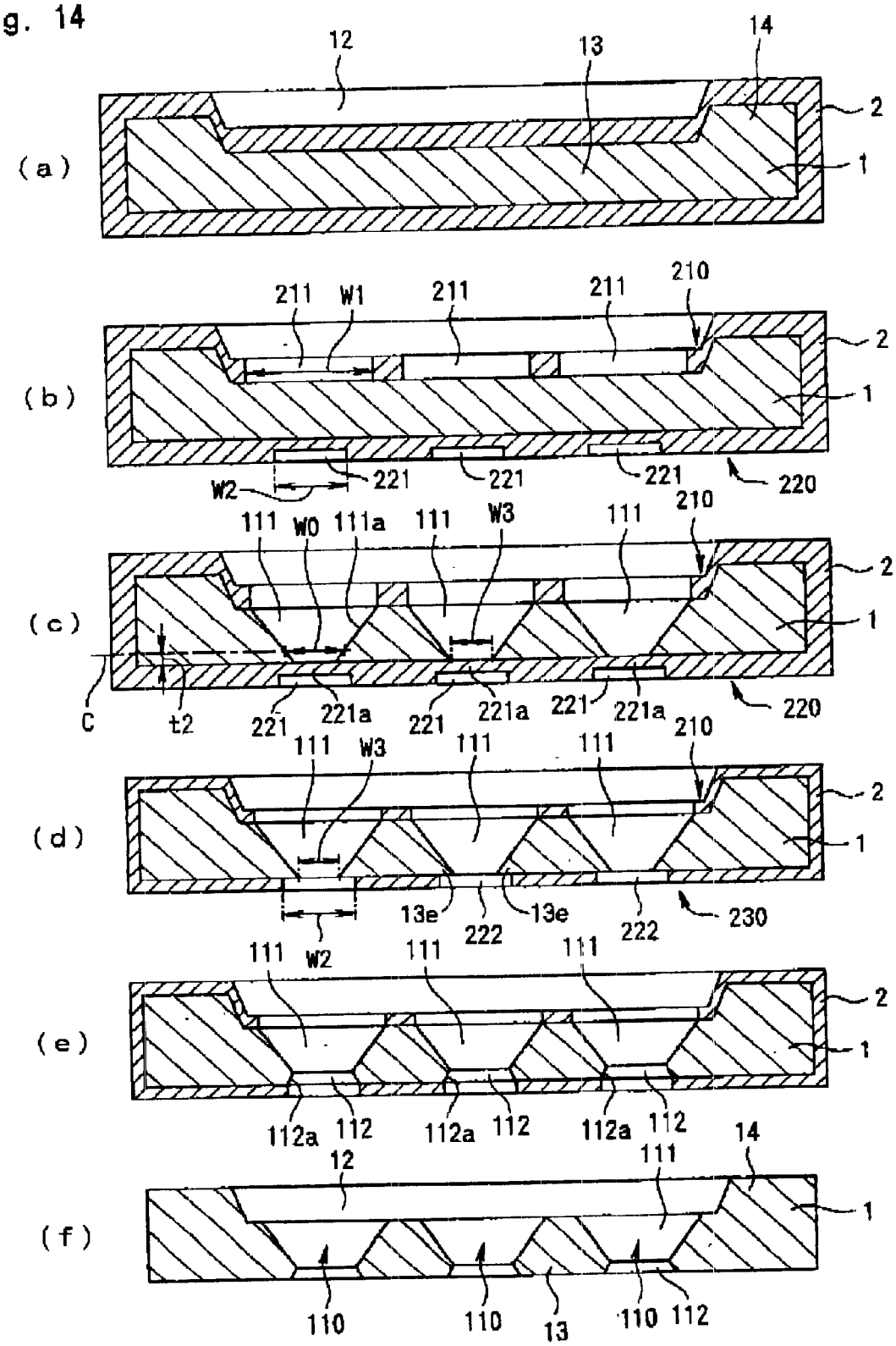
FIGS. 14(a) to 14(f) are diagrams illustrating a second method of manufacturing a mask according to the seventh embodiment of the present invention.

Now, a second method of manufacturing a mask according to the seventh embodiment is described below with reference to FIG. 14.

First, a structure similar shown in FIG. 14(a) is manufactured by performing steps similar to those shown in FIGS. 2(a) to 2(d) according to the second embodiment.

Thereafter, square-shaped openings 211 in the form of through-holes are manufactured in the silicon oxide layer 2 on the first surface (on the same side as that where the recessed portion 12 is formed) of the thin portion 13, at locations corresponding to the locations of apertures 110 such that the aperture size of each opening 211 will become equal to the size W1 of the corresponding first tapered hole 111 at the mask surface. Thereafter, square-shaped recessed portions 221 are formed in the silicon oxide layer 2 on the second surface (opposite to the first surface) of the thin portion 13, at locations corresponding to the locations of apertures 110 such that the size of each recessed portion 221 will become equal to the size W2 (<W0) of the corresponding second tapered hole 112 at the mask surface.

Thus, a first protective layer pattern 210 having through-holes 211 corresponding to the apertures 110 is formed on the first surface of the thin portion 13, and a second protective layer pattern 220 having recessed portions 221 corresponding to the apertures 110 is formed on the second surface of the thin portion 13. FIG. 14(b) shows the structure obtained at this stage of the process.

The wafer 1 is then soaked in an aqueous solution of potassium hydroxide for a predetermined time so that the silicon surface exposed via the openings 211 is wet-etched in a crystal orientation-dependent anisotropic fashion. As a result, tapered through-holes (first tapered holes) 111 with walls 111a oriented in (111)-directions are formed in the wafer 1, at locations corresponding to the openings 211. FIG. 14(c) shows the structure obtained at this stage of the process.

The wafer 1 is then soaked in an aqueous solution of potassium hydroxide for a predetermined time so that the silicon oxide layer 2 is removed by an amount corresponding to the thickness of the bottom portion 221a of the recesses 221. As a result, the recesses 221 become through-holes 222 and thus the second protective layer pattern 220 becomes a third protective layer pattern 230, as shown in FIG. 14(d). The first protective layer pattern 210 remains in a state in which the thickness is uniformly decreased by an amount corresponding to the thickness of the bottom portion 221a. That is, the original thickness of the silicon oxide layer 2 is selected such that the silicon oxide layer 2 remains on the first surface at this stage of the process.

The size W1 of the first tapered hole 111 at the first surface is determined taking into account the thickness of the thin portion 13, such that the size W0 of the aperture 110 at the boundary position C will become equal to the size of the thin-layer pattern to be formed. This means that, at the stage shown in FIG. 14(c), the size W3 of the first tapered hole 111 at the second surface is smaller than the size W0 at the boundary position C. That is, at the stage of the process shown in FIG. 14(d), the edges 13e of the thin portion 13 are exposed via the through-holes (openings formed in the silicon oxide layer 2 on the second surface) of the third protective layer pattern 230.

Thereafter, the wafer 1 is soaked in an aqueous solution of potassium hydroxide for a predetermined time so that the edges 13e of the thin portion 13 exposed via the openings 222 are wet-etched in a crystal orientation-dependent anisotropic fashion. As a result, second tapered holes 112 having walls 112a oriented in particular crystal orientation of the single crystal silicon are formed such that each second tapered holes 112 communicate with a corresponding first tapered hole 111. FIG. 14(e) shows the structure obtained at this stage of the process.

Note that, in this method, it is required that the soaking time should be precisely controlled such that the etching is ended at the boundary position C. Also note that the walls 112a formed by the present method are not necessarily oriented in (111) directions.

The silicon oxide layer 2 is then removed by performing a process, similar to that employed in the second embodiment, on the wafer 1. FIG. 14(f) shows the structure obtained at this stage of the process.

As with the mask manufactured according to the first method described above, the resultant mask obtained by the present method has a structure such as that shown in FIG. 12, formed of single crystal silicon such that the mask surface is formed by a (100) surface of the single crystal silicon, each aperture 110 has two wall portions 111a and 112a that tapered in opposite directions and that expand toward respective mask surfaces opposite to each other, and at least the wall portion 111a of the first tapered hole 111 is oriented in a (111) direction.

In the second method, in contrast to the first method in which the patterning of the silicon oxide layer 2 on the second surface is performed after forming the through-holes 111 in the thin portion 13, the patterning is performed before forming the through-holes 111 in the thin portion 13. If the patterning of the silicon oxide layer 2 is performed after forming the through-holes 111, breakage often occurs during a photolithographic process. Thus, the second method has higher productivity than the first method.

In the first and second methods described above, the patterning of the silicon oxide layer 2 may be performed by a combination of a photolithography process using a positive resist and a wet etching process using a buffer solution of hydrofluoric acid (BHF, such as a mixture of a 50 wt % HF aqueous solution and a 45 wt % NH4F of a volume ratio of 1:6).

Figure 15:
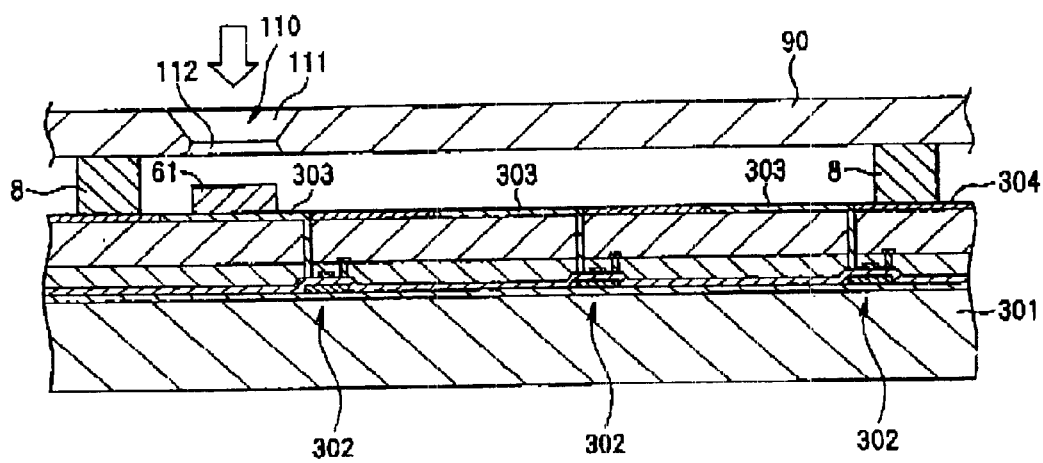
FIG. 15 is a cross-sectional view illustrating a method of manufacturing an organic electroluminescence device according to a third embodiment of the present invention.
Figure 16:
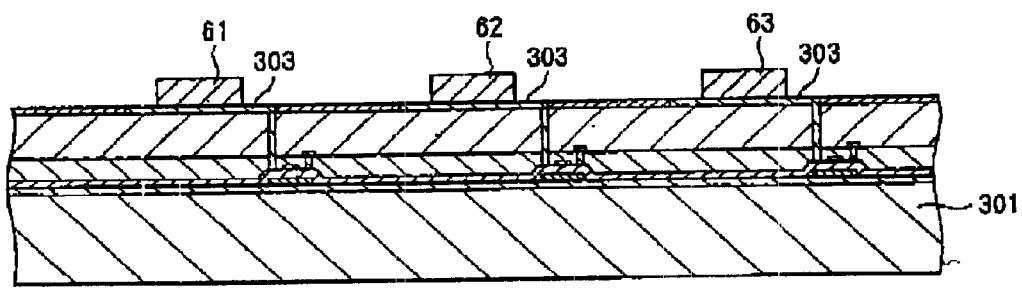
FIG. 16 is a cross-sectional view illustrating the method of manufacturing the organic electroluminescence device according to the third embodiment of the present invention.
Figure 17:
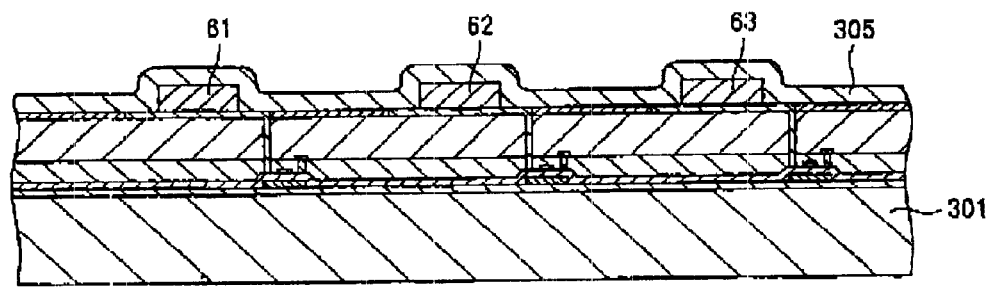
FIG. 17 is a cross-sectional view illustrating the method of manufacturing the organic electroluminescence device according to the third embodiment of the present invention.

A third embodiment of a method of manufacturing an organic EL device according to the present invention is described below with reference to FIGS. 15 to 17.

In this embodiment, by way of example, a process step of forming R (red), G (green), and B (blue) luminescent layers in pixels by vacuum evaporation, included in a process of manufacturing a full-color active matrix organic EL display device, is described.

First, after forming transistors 302 and capacitors of respective pixels, interconnections among them, a driving circuit, and other necessary elements on a glass substrate 301, a first electrode 303 for each pixel is formed, and a first insulating layer 304 is formed in areas other than the first electrode 303. Thereafter, a mask 90 is placed on the glass substrate 301 via a mask holder 8.

In this display device to be manufactured, pixels are arranged at regular intervals in the order of R, G, B, R, G, B, and so on in a direction parallel with a side of the glass substrate. The mask 90 has as many apertures 110 as there are sets of R, G, and B pixels, wherein the apertures 110 are formed at locations corresponding to the respective sets of R, G, and B pixels. The mask 90 may be a mask that is manufactured according to the seventh embodiment described above (using single crystal silicon so as to have apertures 110 each composed of a first tapered hole 111 and a second tapered hole 112). In this case, the mask 90 is placed such that the size where the second tapered holes 112 are located is brought into proximity to the glass substrate 301.

After positioning the mask 90 such that the apertures 110 come to locations where R pixels should be formed, a target material for forming an R (red) luminescent layer is evaporated. As a result, a red luminescent layer 61 is formed on the first electrode 303 on the glass substrate 301, at locations of R pixels. FIG. 15 shows the structure obtained at this stage of the process. The above process of manufacturing the red luminescent layer 61 may be performed, for example, by first forming m-MTDATA serving as a hole injection layer, then forming α-NPD serving as a hole transportation layer, further forming BSB-BCN serving as a luminescent layer, and finally forming Alq3 serving as an electron transportation layer.

The mask 90 is then displaced in a horizontal direction by a distance corresponding to one pixel such that the apertures 110 come to locations of G pixels adjacent to the R pixels, and a target material for forming a G (green) luminescent layer is evaporated. As a result, a green luminescent layer 62 is formed on each first electrode 303 on the glass substrate 301, at locations of G pixels. The above process of manufacturing the green luminescent layer 62 may be performed, for example, by first forming m-MTDATA serving as a hole injection layer, then forming α-NPD serving as a hole transportation layer, and finally forming Alq3 serving as a luminescent layer and also as an electron transportation layer.

The mask 90 is then further displaced in the horizontal direction by a distance corresponding to one pixel such that the apertures 110 come to locations of G pixels adjacent to the R pixels, and a target material for forming a B (blue) luminescent layer is evaporated. As a result, a blue luminescent layer 63 is formed on each first electrode 303 on the glass substrate 301, at locations of B pixels. FIG. 16 shows the structure obtained at this stage of the process. The above process of manufacturing the blue luminescent layer 63 may be performed, for example, by first forming m-MTDATA serving as a hole injection layer, then forming α-NPD serving as a hole transportation layer, further forming bathocuproine (2,9-dimethyl-4,7-diphenyl-1,10-phenanthroline) serving as a luminescent layer and also as a hole block layer, and finally forming Alq3 serving as a luminescent layer.

Thereafter, second electrode layer 305 is formed on the glass substrate 301 by vacuum evaporation. FIG. 17 shows the structure obtained at this stage of the process. If necessary, the upper side of the second electrode layer 305 is sealed.

In the present embodiment, because the mask 90 can be formed of single crystal silicon so that the apertures 110 precisely correspond to pixels with a very small size, the resultant full-color active matrix organic EL display device has high-precision pixels.

Furthermore, because the mask 90 having apertures 110 each composed of the first tapered hole 111 and the second tapered hole 112 is placed in the above-described manner, each luminescent layer is prevented from becoming thin at pattern edges. Thus, good uniformity of the luminescent intensity of the pixels can be obtained over the entire surface of the glass substrate 6. Furthermore, the mask has a high mechanical strength, and thus it is possible to prevent edges of apertures from being broken during use.

A fourth embodiment of a method of manufacturing an organic EL device according to the present invention is described below with reference to FIGS. 18 to 22.

Figure 18:
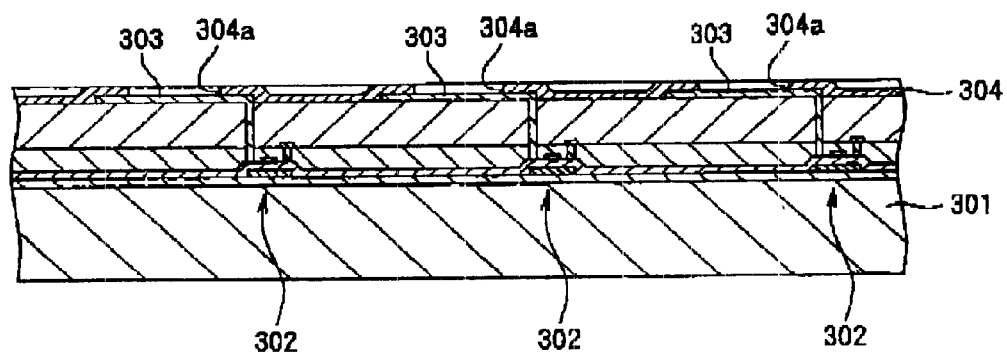
FIG. 18 is a cross-sectional view illustrating a method of manufacturing an organic electroluminescence device according to a fourth embodiment of the present invention.

In this embodiment, first, transistors 302 and capacitors of respective pixels, interconnections among them, a driving circuit, and other necessary elements are first formed on a glass substrate 301, and then a first electrode 303 for each pixel is formed. Thereafter, a first insulating layer 304 is formed on the first electrodes 303. The first insulating layer 304 is patterned so that pixel openings 304a are formed at locations corresponding to the respective first electrodes 303. FIG. 18 shows the structure obtained at this stage of the process.

Figure 19:
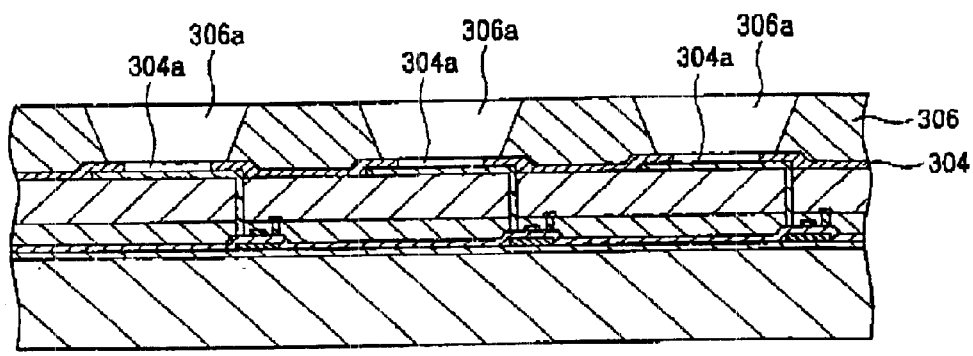
FIG. 19 is a cross-sectional view illustrating the method of manufacturing the organic electroluminescence device according to the fourth embodiment of the present invention.
Figure 20:
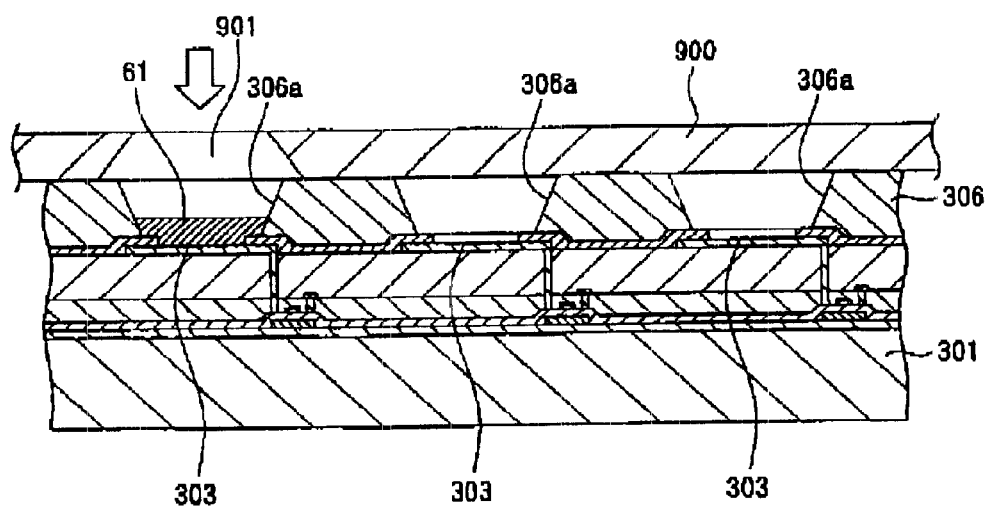
FIG. 20 is a cross-sectional view illustrating the method of manufacturing the organic electroluminescence device according to the fourth embodiment of the present invention.

Thereafter, a second insulating layer 306 having openings 306a, formed at locations corresponding to the locations of the first electrodes 303 so as to have a greater size than the pixel openings 304a, is formed on the first insulating layer 304 such that the second insulting layer 306 has a thickness greater enough than the thickness of any luminescent layer. FIG. 19 shows the structure obtained at this stage of the process. A mask 900 is then placed on the glass substrate such that the mask 900 is brought into contact with the second insulating layer 306.

In this display device to be manufactured, pixels are arranged at regular intervals in the order of R, G, B, R, G, B, and so on in a direction parallel with a side of the glass substrate. The mask 900 has as many apertures 901 as there are sets of R, G and B pixels, wherein the apertures 901 are formed at locations corresponding to the respective sets of R, G, and B pixels.

The mask 900 may be formed of single crystal silicon so as to have a mask surface formed by a (100)-surface of the single crystal silicon and have apertures 901 formed by tapered through-holes with (111)-oriented walls. Such a mask may be manufactured in accordance with one of the embodiments described above (other than the fourth embodiment). However, in the present embodiment, the raised portion in the peripheral area of the mask is removed. The mask 900 is placed such that the mask surface at which the apertures 901 have greater aperture sizes than at the opposite mask surface is brought into proximity to the glass substrate.

Figure 21:
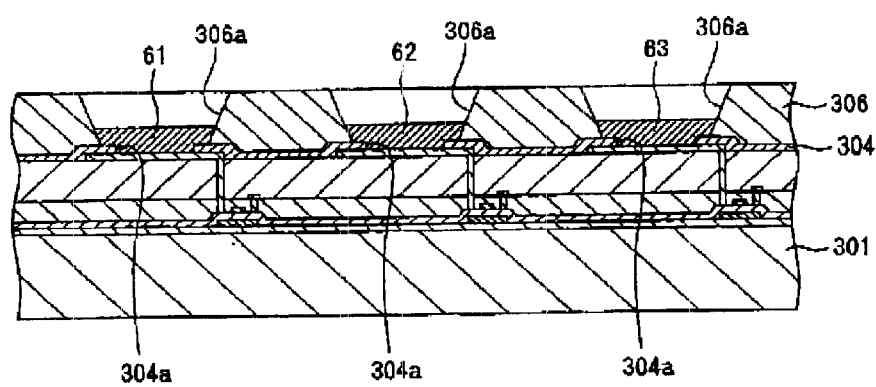
FIG. 21 is a cross-sectional view illustrating the method of manufacturing the organic electroluminescence device according to the fourth embodiment of the present invention.

After positioning the mask 900 such that the apertures 901 come to locations where R pixels should be formed, a target material for forming an R (red) luminescent layer is evaporated. As a result, a red luminescent layer 61 is formed on the first electrode 303 on the glass substrate 301, at locations of R pixels. Thereafter, the mask 900 is displaced in the horizontal direction by a distance corresponding to one pixel, and a target material for forming a G (green) luminescent layer is evaporated thereby forming a green luminescent layer 62. A blue luminescent layer 63 is then formed in a similar manner. The luminescent layers 61 to 63 are formed on the respective electrodes 303 so as to be thicker than the first insulating layer 304. FIG. 21 shows the structure obtained at this stage of the process.

Figure 22:
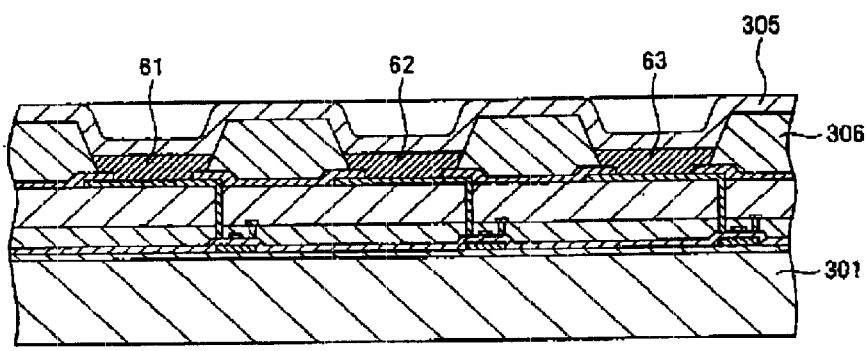
FIG. 22 is a cross-sectional view illustrating the method of manufacturing the organic electroluminescence device according to the fourth embodiment of the present invention.

Thereafter, a second electrode layer 305 is formed on the glass substrate 301 by vacuum evaporation. FIG. 22 shows the structure obtained at this stage of the process. If necessary, the upper side of the second electrode layer 305 is sealed.

In this method, the accuracy of the size of each pixel is determined by the accuracy of the size of the corresponding pixel opening 304a. Therefore, the placing the mask 900 such that the mask surface at which the openings 901 have an obtuse angle (greater aperture size) is brought into proximity to the glass substrate does not cause a reduction in the accuracy of the size of the pixels. If the mask 900 is placed in such a manner, it is possible to prevent edges of the openings from being broken.

Although in the embodiments described above, the anisotropic wet etching of single crystal silicon is performed using an aqueous solution of potassium hydroxide, another alkali solution such as an aqueous solution of tetramethylammoniumhydroxide or an aqueous solution of ethylenediaminepyrocatechol may also be employed. In the case where an aqueous solution of potassium hydroxide is employed, the concentration is preferably selected within the range from 2 to 40 wt % and more preferably from 10 to 30 wt %.

In particular, when the mask is used to manufacture an active matrix organic EL device, it is desirable to use an aqueous solution of tetramethylammoniumhydroxide or (with a concentration of 20 to 30 wt % at a temperature higher than 80°) to avoid contamination with alkali metal.

In the embodiments described above, the mask according to the present invention is used as a vacuum evaporation mask. However, it should be understood that the mask according to the present invention may also be used to directly form a thin-layer pattern using a method (such as sputtering, ion plating, etc.) other than vacuum evaporation.

Organic EL devices can be used in a wide variety of electronic devices such a mobile personal computer, a portable telephone, and a digital still camera.

Figure 23:
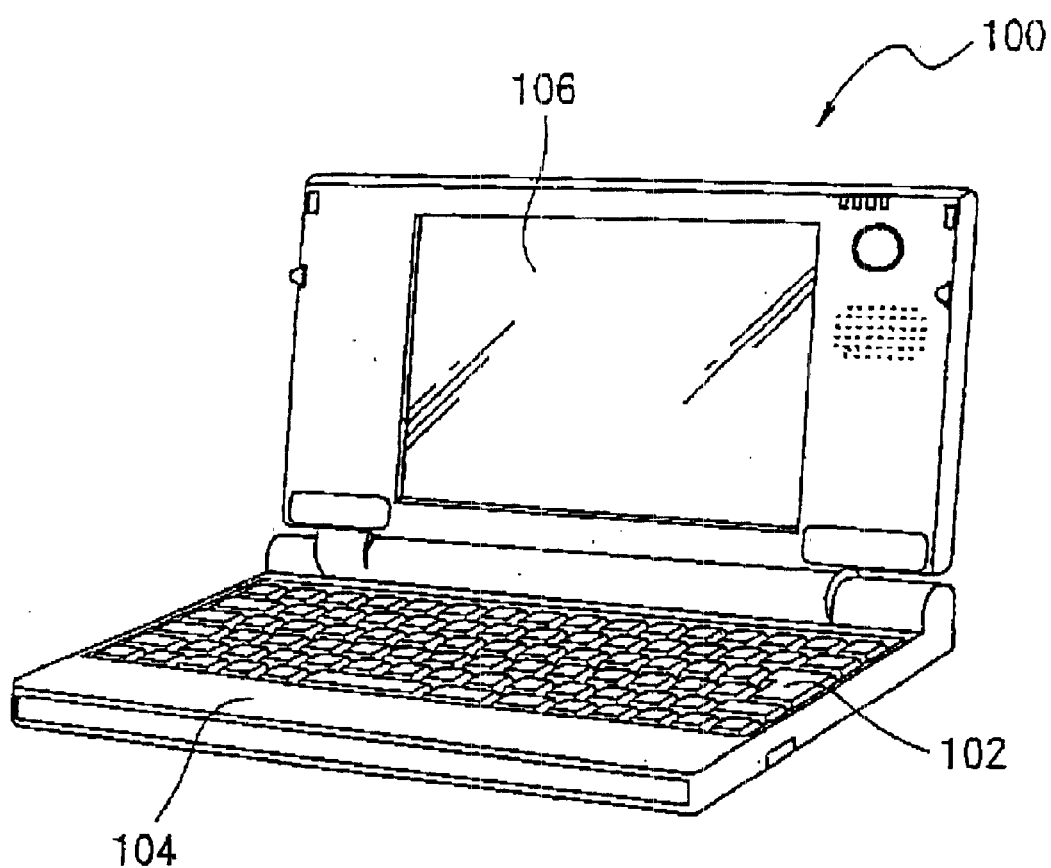
FIG. 23 is a perspective view showing the structure of a personal computer that is one of electronic devices using an organic electroluminescence device according to the present invention.

FIG. 23 is a perspective view illustrating the structure of a mobile personal computer. In FIG. 23, the personal computer 100 can include a main part 104 having a keyboard 102 and a display unit 106 using an organic electroluminescence device.

Figure 24:
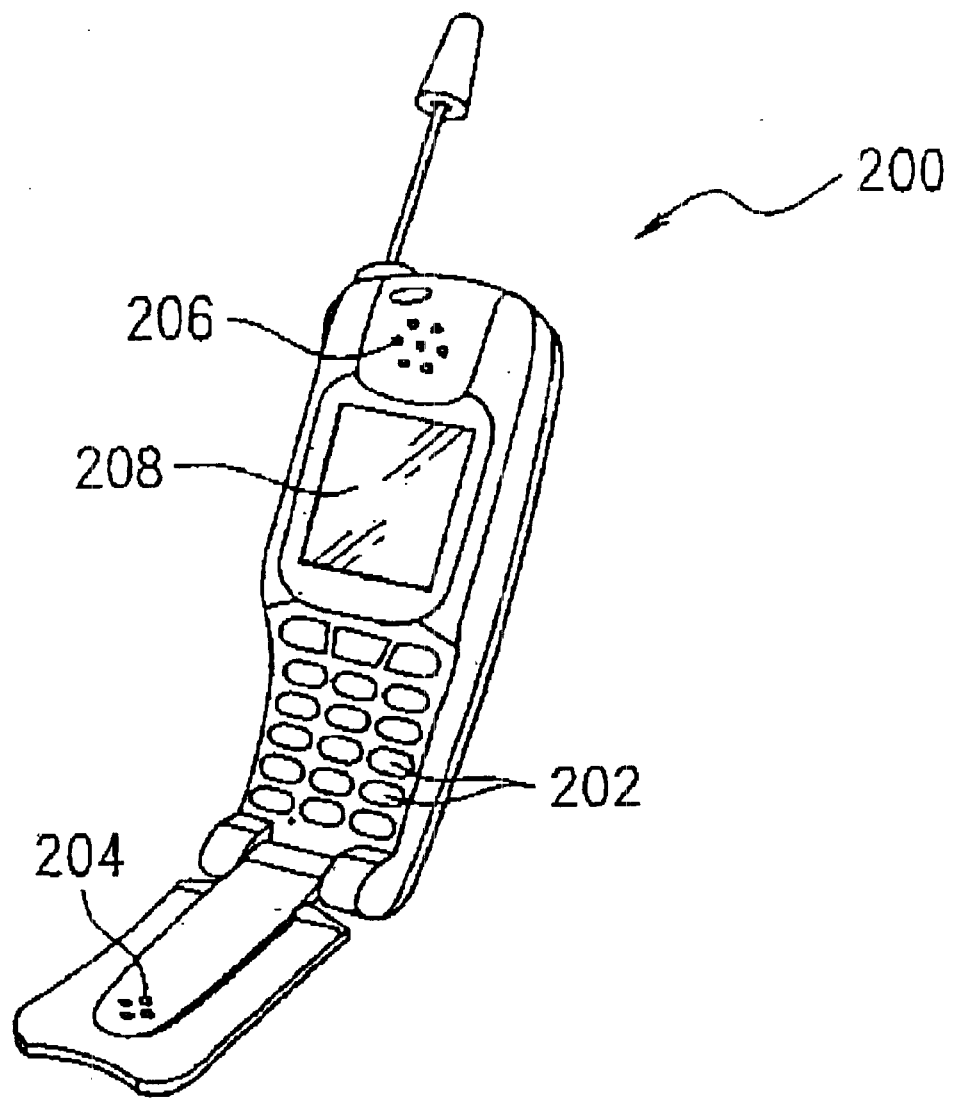
FIG. 24 is a perspective view showing the structure of a portable telephone that is one of electronic devices using an organic electroluminescence device according to the present invention.

FIG. 24 is a perspective view of a portable telephone. In FIG. 24, the portable telephone 200 includes a plurality of operation control buttons 202, an earpiece 204, a mouthpiece 206, and a display panel 208 using an organic electroluminescence device.

In addition to the personal computer shown in FIG. 23, the portable telephone shown in FIG. 24, and a digital still camera shown, the organic electroluminescence display device according to the present invention may also be used in other various electronic devices such as a television, a video tape recorder with a viewfinder or a monitor, a car navigation device, a pager, an electronic notepad, a calculator, a word processor, a workstation, a video telephone, a POS terminal, and a device including a touch panel.

In the mask according to the present invention, as described above, apertures have high enough accuracy to form high-precision pixels without causing the mask to be bent or deformed and without having to applying a tensile force to the mask during a thin-layer formation process. Thus, the mask can be used to manufacture a thin-layer pattern of high-precision pixels of an organic EL device.

The mask production method according to the present invention makes it possible to manufacture a having apertures with high enough accuracy to form high-precision pixels without causing the mask to be bent or deformed and without having to applying a tensile force to the mask during a thin-layer formation process.

Furthermore, according to the organic EL device production method of the present invention, a high-precision thin-layer pattern serving as a layer of an organic EL element can be formed by means of vacuum evaporation to manufacture, for example, a high-precision full-color active matrix organic EL display device.

Using an organic EL device according to the present invention, it is possible to manufacture a high-precision full-color active matrix organic EL display device.

What is claimed is:

1. A mask for use in vacuum evaporation manufacturing of a thin-layer pattern that serves as a layer of an organic electroluminescence element, the mask comprising:

an aperture corresponding to the thin-layer pattern, the mask being formed of single crystal silicon and having a through-hole serving as the aperture formed by anisotropic wet etching using a crystal orientation dependence.

2. A mask for use in vacuum evaporation manufacturing of a thin-layer pattern that serves as a layer of an organic electroluminescence element, the mask comprising:

an aperture corresponding to the thin-layer pattern, the mask being formed of single crystal silicon so as to have a mask surface formed by a (100) surface of the single crystal silicon and a through-hole with (111)-oriented walls serving as the aperture.

3. A mask for use in manufacturing a thin layer having a predetermined pattern on a substrate surface, the mask being formed of single crystal silicon and comprising:

an aperture corresponding to the pattern;

the size of the aperture changing in a mask thickness direction such that the size has, at a boundary position, a minimum value corresponding to the size of the pattern and the size increases toward both a first and second mask surface; and a first distance from the boundary position to the first mask surface and a second distance from the boundary position to the second mask surface being different from each other.

4. The mask according to claim 3, the mask surface being formed by a (100)-surface of single crystal silicon, and the aperture including two wall portions that are tapered in opposite directions and that expand from the boundary position toward respective mask surfaces opposite to each other, and at least one wall portion being oriented in a (111)-direction.

5. The mask according to claim 4, the mask having a thin portion in which the aperture is formed and a thick portion in which no aperture is formed.

6. A method of vacuum evaporation manufacturing a mask for use in manufacturing a thin-layer pattern that serves as a layer of an organic electroluminescence element, the mask having a aperture corresponding to the thin-layer pattern, the method comprising:

forming a through-hole as the aperture in a single crystal silicon substrate having a (100)-oriented crystal surface by anisotropic wet etching using the crystal orientation dependence, such that the through-hole has a (111)-oriented wall.

7. A method of manufacturing a mask, according to claim 6, further comprising:

thinning the single crystal silicon substrate by etching in a thickness direction thereof such that a thin portion having a uniform thickness is formed in an partial area of the single crystal silicon substrate;

after thinning the single crystal silicon substrate, the through-hole being formed in the thin portion by anisotropic wet etching using the crystal orientation dependence.

8. A method of manufacturing a mask for use in manufacturing a thin layer having a predetermined pattern on a substrate surface, the mask having a aperture corresponding to the pattern, the method comprising:

preparing a substrate including a base substrate, an insulating layer formed on one surface of the base substrate, and a single crystal silicon layer formed on the insulating layer;

removing the base substrate such that at least a partial area of the base substrate is removed over the entire thickness of the base substrate; and anisotropic etching the single crystal silicon layer remaining in the area from which the base substrate has been removed, so as to form a through-hole serving as the aperture in the single crystal silicon layer.

9. A method of manufacturing a mask, comprising:

forming a thin portion having a uniform thickness in a partial substrate area by etching a single crystal silicon substrate having a (100)-oriented crystal surface in a thickness direction of the single crystal silicon substrate;

forming an aperture in the thin portion;

forming a first protective layer pattern having a through-hole corresponding to the aperture, on a first surface of the thin portion;

forming a second protective layer pattern having a recessed portion at a location corresponding to the location of the aperture, on a second surface of the thin portion;

forming a through-hole in the thin portion at a location corresponding to the location of the aperture by anisotropic wet etching using the crystal orientation dependence such that an aperture size of the through-hole is greater at the first surface than at a boundary position and is smaller at the second surface than at the boundary position and than the size of a recessed portion;

converting the second protective layer pattern into a third protective layer pattern by performing wet etching such that the bottom of the recessed portion is perforated so that the recessed portion becomes a through-hole while maintaining the protective layer on the first surface; and anisotropic wet-etching the thin portion, using the crystal orientation dependence such that a part of the thin portion exposed via the through-hole formed in the third protection layer pattern is etched until the aperture size at the boundary position becomes equal to a predetermined size.

10. The method of manufacturing an organic electroluminescence device, comprising:

forming a thin-layer pattern serving as a layer of the organic electroluminescence element by performing vacuum evaporation using the mask according to claim 1.

11. The method of manufacturing an organic electroluminescence device, comprising:

forming a thin-layer pattern serving as a layer of the organic electroluminescence element by performing vacuum evaporation using the mask according to claim 6.

12. An organic electroluminescence device manufactured by the method according to claim 10.

13. An organic electroluminescence device manufactured by the method according to claim 11.

* * * * *